United States Patent
Khasnis et al.

(10) Patent No.: US 9,716,472 B2
(45) Date of Patent: Jul. 25, 2017

(54) VOLTAGE FOLLOWER CIRCUIT TO MITIGATE GAIN LOSS CAUSED BY FINITE OUTPUT IMPEDANCE OF TRANSISTORS

(71) Applicant: Signalchip Innovations Private Limited, Bangalore (IN)

(72) Inventors: Himamshu Gopalakrishna Khasnis, Bengaluru (IN); Anantha Melavarige Subraya, Shimoga (IN); Naveen Mahadev, Bangalore (IN)

(*) Notice: Subject to any disclaimer, the term of this patent is extended or adjusted under 35 U.S.C. 154(b) by 0 days.

(21) Appl. No.: 15/211,100

(22) Filed: Jul. 15, 2016

(65) Prior Publication Data
US 2017/0111013 A1    Apr. 20, 2017

(30) Foreign Application Priority Data
Oct. 20, 2015    (IN) .......................... 5657/CHE/2015

(51) Int. Cl.
*H03F 1/22*    (2006.01)
*H03F 1/02*    (2006.01)
*H03F 3/50*    (2006.01)

(52) U.S. Cl.
CPC .............. *H03F 1/025* (2013.01); *H03F 3/50* (2013.01); *H03F 3/505* (2013.01); *H03F 2200/453* (2013.01); *H03F 2200/555* (2013.01); *H03F 2200/69* (2013.01)

(58) Field of Classification Search
CPC ........................................................ H03F 1/22
USPC ..................... 330/311, 296, 295, 124 R, 285
See application file for complete search history.

(56) References Cited

U.S. PATENT DOCUMENTS

| | | | | |
|---|---|---|---|---|
| 4,760,284 A * | 7/1988 | Taylor | ....................... | G05F 3/22 327/541 |
| 7,876,152 B2 * | 1/2011 | Moyer | .................. | H03F 1/3205 326/80 |
| 9,024,700 B2 * | 5/2015 | Ranta | ..................... | H03H 11/28 327/554 |
| 9,225,378 B2 * | 12/2015 | Burgener | .................. | H01P 1/15 |
| 9,484,834 B2 * | 11/2016 | Weis | ..................... | H02M 7/217 |
| 2015/0035586 A1 * | 2/2015 | Weis | .................... | H03K 17/687 327/436 |

* cited by examiner

*Primary Examiner* — Henry Choe
(74) *Attorney, Agent, or Firm* — The Law Office of Austin Bonderer, PC; Austin Bonderer

(57) ABSTRACT

Methods and circuits for maximizing gain of a voltage follower circuit are provided. The method includes using a NMOS voltage replica generation circuit, a PMOS voltage replica generation circuit, a NPN BJT voltage replica generation circuit, a n-channel JFET voltage replica generation circuit, a P-Channel JFET voltage replica generation circuit and a PNP BJT voltage replica generation circuit. The overall gain for the various transistor families is almost equal to unity.

3 Claims, 23 Drawing Sheets

VOLTAGE FOLLOWER CIRCUIT TO MITIGATE GAIN LOSS CAUSED BY FINITE OUTPUT IMPEDANCE OF TRANSISTORS

CROSS REFERENCE TO RELATED APPLICATIONS

This application claims priority to Indian Patent Application number 5657/CHE/2015 filed on Oct. 20, 2015, the complete disclosure of which, in its entirely, is herein incorporated by reference.

BACKGROUND

Technical Field

The embodiments herein generally relate to voltage follower, and more particularly, to a circuit and method for maximizing the gain of the voltage follower.

Description of the Related Art

Voltage followers, also known as a unity gain buffers, are commonly used circuits in many designs. Typically, an output of a voltage follower follows or tracks an input voltage. Voltage follower circuits typically have high input impedance and low output impedance. One of the common applications of voltage follower circuits is in the design of multistage filters. Voltage followers are used in design of multistage filters to isolate each stage of the multistage filter from the other. Another application of the voltage follower is to drive Analog to Digital (ADC) convertors. The advantage of using voltage followers for this application is that, in some cases ADCs can sample inputs having large current and it is very important to control the current at each stage.

Also, voltage followers can behave as voltage buffers. For instance, if the output resistance of a first stage of a design is high, it is recommended to add a voltage follower at its output to function as a voltage buffer, so that the voltage in the next and later stages will almost be the same as it is in the first stage.

FIG. 1 illustrates a conventional voltage follower circuit 100 according to an exemplary scenario. The conventional voltage follower circuit 100 includes an n-channel metal oxide semi-conductor (NMOS) transistor 102, an input voltage Vin 104, an output voltage Vout 106, a fixed voltage 108, and a ground terminal 110. The NMOS transistor 102 includes a gate terminal 112, a drain terminal 114, and a source terminal 116. The input voltage Vin 104 is provided as an input at the gate terminal 112 and the output voltage Vout 106 is obtained as an output at the source terminal 116. The fixed voltage 108 is connected to the drain terminal 114. In one embodiment, the source terminal 116 is connected to a bias current source, and other terminal of the bias current source is connected to the ground terminal 110.

FIG. 2 illustrates a small signal model of the conventional voltage follower circuit 200 according to an exemplary scenario. The small signal model of the conventional voltage follower circuit 200 includes an input voltage Vin 104, an output voltage Vout 106, a ground terminal 110, and a voltage controlled current source 202. In an embodiment, the current source 202 models the transconductance gm of the NMOS transistor 102, and r0 is used to model the output resistance of the transistor. The transconductance gm is a ratio of the current variation at the output to the voltage variation between the gate terminal 112 and the source terminal 116. The transconductance is also known as mutual conductance. In an embodiment, a small signal model also known as AC analysis model is used for calculation of the gain. The relation is as follows:

$$gm*(Vin-Vout)*r0=Vout$$

However Gain (G)=Vout/Vin.

Hence, Gain (G)=gm*r0/(1+gm*r0);

and the effective input capacitance (Cin) of the circuit 200 is given by the equation, $$Cin=Cgd+Cgs(1-(gm*r0)/(1+gm*r0))=Cgd+Cgs(1-G)$$

where,

Cin is the total input capacitance.

Cgd is the measure of capacitance between the gate terminal 112 and drain terminal 116 of the NMOS transistor 102. Cgs is the measure of the capacitance between the gate terminal 112 and source terminal 116 of the NMOS transistor. In one embodiment, assuming reasonable values for gm*r0, Cgd and Cgs (i.e. gm*r0=~10), an approximate value of gain may be 10/11=0.909. In one embodiment, if the Cgd=C, then Cgs=~2*C, and so Cin=~1.182*C.

The gain of the ideal voltage follower is equal to 1. Because of the finite output impedance of the transistor (r0), the gain of the conventional voltage follower is approximately 0.909. By increasing the value of gm*r0, the gain of the conventional voltage follower circuit 100 can be brought closer to 1. In one embodiment, the gain of the conventional voltage follower circuit 100 is increased by increasing both W and L proportionally while maintaining the same W/L, but the input capacitance (Cin) is increased significantly since all the capacitances (Cgd and Cgs) are functions of W*L. Consequently, the input impedance of the voltage follower is reduced at higher frequencies making it difficult to drive it. Therefore, it is also advantageous to keep the input capacitance of the voltage follower as low as possible.

Accordingly, there remains a need for a circuit and a method to maximize the gain of the voltage follower circuit in an efficient way.

SUMMARY

In view of the foregoing, an embodiment herein provides a voltage follower circuit to mitigate gain loss. The voltage follower circuit includes a voltage replica generation circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit. The NMOS based voltage follower circuit includes (a) a NMOS transistor, which includes a gate terminal, a drain terminal, and a source terminal, wherein the gate terminal is connected to an input voltage Vin, the source terminal is connected to a bias current source and (b) a NMOS voltage replica generator. The NMOS voltage replica generator includes one or more NMOS transistors. The NMOS voltage replica generator is connected to the drain terminal of said NMOS transistor and a fixed voltage, the NMOS voltage replica generator creates a close replica of the input voltage Vin at the drain terminal of the NMOS transistor. The NPN BJT based voltage follower circuit includes (a) a NPN BJT transistor that includes a base terminal, a collector terminal, and an emitter terminal, the base terminal is connected to the input voltage Vin, the emitter terminal is connected to the bias current source and (b) a NPN BJT voltage replica generator, that includes one or more NPN BJT transistors, the NPN BJT voltage replica generator is connected to the collector terminal and the fixed voltage. The n-channel JFET based voltage follower circuit includes (a) a n-channel JFET transistor that includes a gate terminal, a drain terminal, and a source terminal, the gate terminal is connected to the input voltage Vin and (b) a n-channel JFET voltage replica generator 710, which includes one or more n-channel JFET transistors, the n-channel JFET voltage replica generator is connected to the n-channel JFET drain terminal and the fixed voltage. The PMOS based voltage follower circuit includes (a) a PMOS transistor that includes a gate terminal, a source terminal, and a drain terminal, the gate terminal is connected to the input voltage Vin and (b) a PMOS voltage replica generator, which includes one or more PMOS transistors, the PMOS voltage replica generator is connected to the PMOS drain terminal and a fixed voltage. The P-Channel JFET based voltage follower circuit includes (a) a P-Channel JFET transistor that includes a gate terminal, a source terminal, and a drain terminal, the gate terminal is connected to the input voltage Vin and (b) a P-Channel JFET voltage replica generator that includes one or more P-Channel JFET transistors, the P-Channel JFET voltage replica generator is connected to the drain terminal of the P-Channel transistor and the fixed voltage. The PNP BJT based voltage follower circuit includes (a) a PNP BJT transistor that includes a base terminal, a emitter terminal, and a collector terminal, the base terminal is connected to the input voltage Vin and (b) a PNP BJT voltage replica generator that includes one or more PNP BJT transistors, the PNP BJT voltage replica generator is connected to the collector terminal of the PNP BJT transistor and the fixed voltage.

In another aspect, a voltage follower circuit to mitigate gain loss caused by a finite output impedance of one or more transistors is provided. The voltage follower circuit includes a voltage follower circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit. The NMOS based voltage follower circuit includes (a) a first NMOS transistor that includes a first gate terminal, a first drain terminal, and a first source terminal, the first drain terminal is connected to the fixed voltage, (b) a second NMOS transistor that includes a second gate terminal, a second drain terminal, and a second source terminal, the second gate terminal is connected to an input voltage Vin, the second drain terminal is connected to the first source terminal, and the second source terminal is connected to a bias current source, and (c) a NMOS level shifter that is connected between the first gate terminal and the second gate terminal. The NMOS level shifter adds a voltage depending on the process corner, a supply voltage, and a temperature. The NPN BJT based voltage follower circuit includes (a) a first NPN BJT transistor that includes a first base terminal, a first collector terminal, and a first emitter terminal, the first collector terminal is connected to the fixed voltage, (b) a second NPN BJT transistor that includes a second base terminal, a second collector terminal, and a second emitter terminal, the second base terminal is connected to the input voltage Vin, the second collector terminal is connected to the first emitter terminal, and the emitter terminal is connected to the bias current source, and (c) a NPN BJT level shifter that is connected between the first base terminal and the second base terminal, the NPN BJT level shifter adds a voltage depending on the process corner, the supply voltage, and the temperature. The n-channel JFET based voltage follower circuit includes (a) a first n-channel JFET transistor that includes a first gate terminal, a first drain terminal, and a first source terminal, the first drain terminal is connected to the fixed voltage, (b) a second n-channel JFET transistor that includes a second gate terminal, a second drain terminal, and a second source terminal, the second gate terminal is connected to the input voltage Vin, the second drain terminal is connected to the first source terminal, and the second source terminal is connected to the bias current source, and (c) a n-channel JFET level shifter that is connected between the first gate terminal and the second gate terminal, the n-channel JFET level shifter adds a voltage depending on the process corner, the supply voltage, and the temperature. The PMOS based voltage follower circuit includes (a) a first PMOS transistor that includes a first gate terminal, a first source terminal, and a first drain terminal, the first gate terminal is connected to the input voltage Vin and the first source terminal is connected to the bias current source, (b) a second PMOS transistor that includes a second gate terminal, a second source terminal, and a second drain terminal, the second source terminal is connected to the first drain terminal and second drain terminal is connected to a ground terminal, and (c) a PMOS level shifter that is connected between the first gate terminal and the second gate terminal, the PMOS level shifter adds a voltage depending on the process corner, the supply voltage, and the temperature. The P-Channel JFET based voltage follower circuit includes (a) a first P-Channel JFET transistor that includes a first gate terminal, a first source terminal, and a first drain terminal, the first gate terminal is connected to the input voltage Vin and the first source terminal is connected to the bias current source, (b) a second P-Channel JFET transistor that includes a second gate terminal, a second source terminal, and a second drain terminal, the second source terminal is connected to the first drain terminal and the second drain terminal is connected to the ground terminal, and (c) a P-Channel JFET level shifter that is connected between the first gate terminal and the second gate terminal, the P-Channel JFET level shifter adds a voltage depending on the process corner, the supply voltage, and the temperature. The PNP BJT based voltage follower circuit includes (a) a first PNP BJT transistor that includes a first base terminal, a first emitter terminal, and a first collector terminal, the first base terminal is connected to the input voltage Vin and the first emitter terminal is connected to the bias current source, (b) a second PNP BJT transistor that comprises a second base terminal, a second emitter terminal, and a second collector terminal, the second emitter terminal is connected to the first collector terminal and the second collector terminal is connected to the ground terminal, and (c) a PNP BJT level shifter that is connected between the first base terminal and the second base terminal, the PNP BJT level shifter adds a voltage depending on the process corner, the supply voltage, and the temperature.

In yet another aspect, a voltage follower circuit to mitigate gain loss caused by a finite output impedance of one or more transistors is provided. The voltage follower circuit includes a voltage follower circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit. The NMOS based voltage follower circuit includes (a) a first NMOS transistor that includes a first gate terminal, a first drain terminal, and a first source terminal, the first gate terminal is connected to an input voltage Vin, the source terminal is connected to a bias current source, (b) a second NMOS transistor that includes a second gate terminal, a second drain terminal, and a second source terminal, the second gate terminal is connected to the input voltage Vin, the second drain terminal is connected to a fixed voltage, and the second source terminal is connected to said first drain terminal, (c) a third NMOS transistor, that includes a third gate terminal, a third drain terminal, and a third source terminal, the third gate terminal is connected to input voltage Vin, the third drain terminal is connected to the second source terminal, and the source terminal is connected to the bias current source, (d) a first NMOS level shifter, which is connected between the first gate terminal and the second gate terminal, and (e) a second NMOS level shifter, which is connected between the second gate terminal and the third gate terminal. The PMOS based voltage follower circuit includes (a) a first PMOS transistor that includes a first gate terminal, a first source terminal, and a first drain terminal, the first PMOS gate terminal is connected to the input voltage Vin and the PMOS source terminal is connected to a bias current source, (b) a second PMOS transistor that includes a second gate terminal, a second source terminal, and a second drain terminal, the second PMOS source terminal is connected to said first PMOS drain terminal and said second PMOS drain terminal is connected to a ground terminal, (c) a third PMOS transistor, which includes a third gate terminal, a third drain terminal, and a third source terminal, the third source terminal is connected to the second drain terminal, and the third drain terminal is connected to said ground terminal. (d) a first PMOS level shifter that is connected between the first gate terminal and the second gate terminal, and (e) a second PMOS level shifter that is connected between the second gate terminal and the third gate terminal. The NPN BJT based voltage follower circuit includes (a) a first NPN BJT transistor that includes a first base terminal, a first collector terminal, and a first emitter terminal. (b) a second NPN BJT transistor that includes a second base terminal, a second collector terminal, and a second emitter terminal, the first emitter terminal is connected to the second collector terminal, the second emitter terminal is connected to the bias current source, and the first collector terminal is connected to the fixed voltage, (c) a third NPN BJT transistor, which includes a third base terminal, a third collector terminal, and a third emitter terminal, the third base terminal is connected to the input voltage Vin, the third collector terminal is connected to the second emitter terminal of the second NPN BJT transistor, and the third emitter terminal is connected to said bias current source, (d) a first NPN BJT level shifter that is connected between the first base terminal and the second base terminal, and (e) a second NPN BJT level shifter that is connected between the second base terminal and the third base terminal. The n-channel JFET based voltage follower circuit includes (a) a first n-channel JFET transistor that includes a first gate terminal, a first drain terminal, and a first source terminal (b) a second n-channel JFET transistor that includes a second gate terminal, a second drain terminal, and a second source terminal, the first source terminal is connected to the second drain terminal, the second source terminal is connected to the bias current source and the first drain terminal is connected to the fixed voltage, (c) a third n-channel JFET transistor, which comprises a third gate terminal, a third drain terminal, and a third source terminal, the third gate terminal is connected to the input voltage Vin, the third drain terminal is connected to the second source terminal, and the third source terminal is connected to the bias current source, (d) a first n-channel JFET level shifter that is connected between the first gate terminal and the second gate terminal, and (e) a second n-channel JFET level shifter that is connected between the second gate terminal and the third gate terminal. The P-Channel JFET based voltage follower circuit includes (a) a first P-Channel JFET transistor that includes a first gate terminal, a first source terminal, and a first drain terminal, (b) a second P-Channel JFET transistor that includes a second gate terminal, a second source terminal, and a second drain terminal, the first source terminal is connected to the bias current source, the first drain terminal is connected to the second source terminal, and the second drain terminal is connected to the ground terminal. (c) a third P-Channel JFET, which includes a third gate terminal, a third source terminal, and a third drain terminal, the third drain terminal is connected to the ground terminal, and the third source terminal is connected to the second drain terminal, (d) a first P-Channel JFET level shifter that is connected between the first gate terminal and the second gate terminal, and (e) a second P-Channel JFET level shifter that is connected between the second gate terminal and the third gate terminal. The PNP BJT based voltage follower circuit includes (a) a first PNP BJT transistor that includes a first base terminal, a first emitter terminal, and a first collector terminal 2208A, (b) a second PNP BJT transistor that includes a second base terminal, a second emitter terminal, and a second collector terminal, the first collector terminal is connected to the second emitter terminal, the second collector terminal is connected to the fixed voltage and the first emitter terminal is connected to the bias current source, (c) a third PNP BJT transistor, which includes a third base terminal, a third emitter terminal, and a third collector terminal, the third emitter terminal is connected to the second collector terminal of the second PNP BJT terminal, and the third collector terminal is connected to said ground terminal, (d) a first PNP BJT level shifter that is connected between the first base terminal and to the second base terminal, and (e) a second PNP BJT level shifter that is connected between the second base terminal and to the third base terminal.

Embodiments of the present disclosure substantially eliminate or at least partially address the aforementioned problems in the prior art, and provide voltage follower based circuits that have gains closer to unity and reduction in input capacitance enabling the circuits to perform more efficiently.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated using identical numbers.

Embodiments of the present disclosure will now be described, by way of example only, with reference to the following diagrams wherein.

Figure 1:
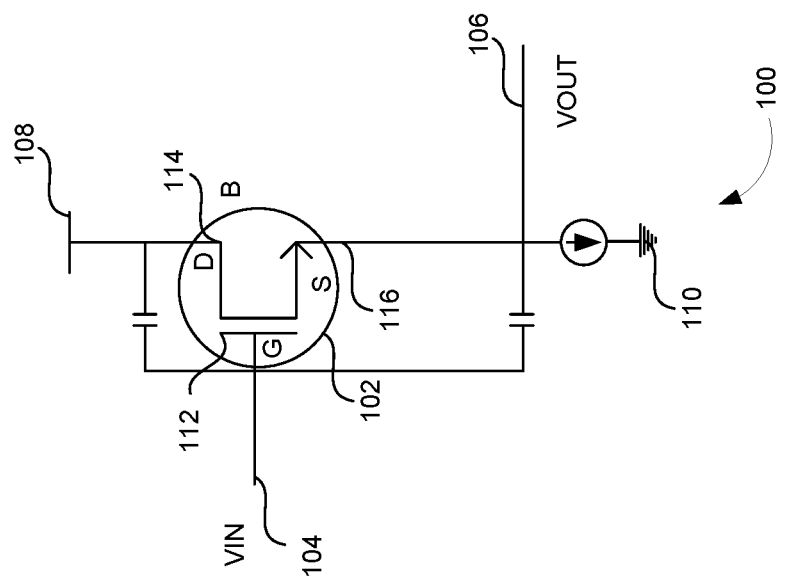
FIG. 1 illustrates a conventional voltage follower circuit according to an exemplary scenario herein.
Figure 2:
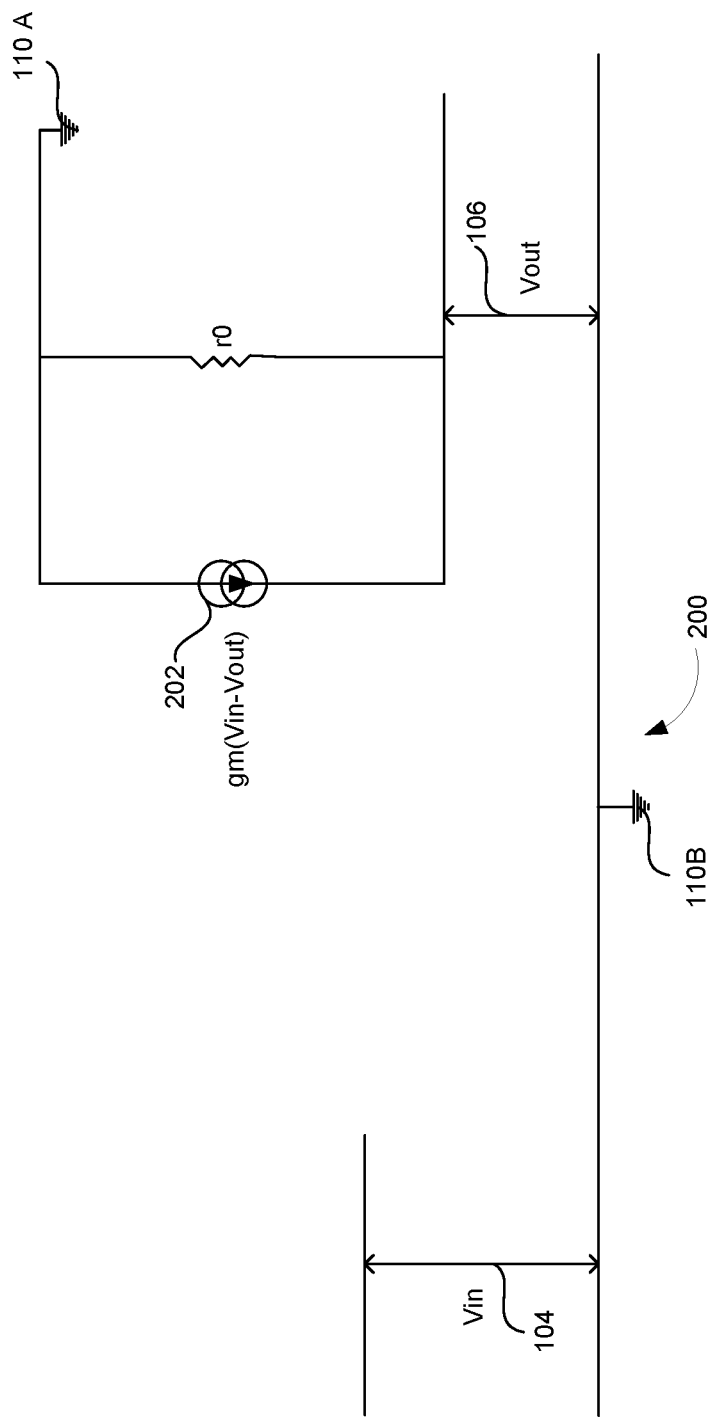
FIG. 2 illustrates a small signal model of the conventional voltage follower circuit according to an exemplary scenario herein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is point

DETAILED DESCRIPTION OF EMBODIMENTS

The following detailed description illustrates embodiments of the present disclosure and ways in which they may be implemented. Although some modes of carrying out the present disclosure have been disclosed, those skilled in the art would recognize that other embodiments for carrying out or practicing the present disclosure are also possible.

In one aspect, a voltage follower circuit to mitigate gain loss. The voltage follower circuit includes a voltage replica generation circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit. The NMOS based voltage follower circuit includes (a) a NMOS transistor, which includes a gate terminal, a drain terminal, and a source terminal, wherein the gate terminal is connected to an input voltage Vin, the source terminal is connected to a bias current source and (b) a NMOS voltage replica generator. The NMOS voltage replica generator includes one or more NMOS transistors. The NMOS voltage replica generator is connected to the drain terminal of said NMOS transistor and a fixed voltage, the NMOS voltage replica generator creates a close replica of the input voltage Vin at the drain terminal of the NMOS transistor. The NPN BJT based voltage follower circuit includes (a) a NPN BJT transistor that includes a base terminal, a collector terminal, and an emitter terminal, the base terminal is connected to the input voltage Vin, the emitter terminal is connected to the bias current source and (b) a NPN BJT voltage replica generator, that includes one or more NPN BJT transistors, the NPN BJT voltage replica generator is connected to the collector terminal and the fixed voltage. The n-channel JFET based voltage follower circuit includes (a) a n-channel JFET transistor that includes a gate terminal, a drain terminal, and a source terminal, the gate terminal is connected to the input voltage Vin and (b) a n-channel JFET voltage replica generator 710, which includes one or more n-channel JFET transistors, the n-channel JFET voltage replica generator is connected to the n-channel JFET drain terminal and the fixed voltage. The PMOS based voltage follower circuit includes (a) a PMOS transistor that includes a gate terminal, a source terminal, and a drain terminal, the gate terminal is connected to the input voltage Vin and (b) a PMOS voltage replica generator, which includes one or more PMOS transistors, the PMOS voltage replica generator is connected to the PMOS drain terminal and a fixed voltage. The P-Channel JFET based voltage follower circuit includes (a) a P-Channel JFET transistor that includes a gate terminal, a source terminal, and a drain terminal, the gate terminal is connected to the input voltage Vin and (b) a P-Channel JFET voltage replica generator that includes one or more P-Channel JFET transistors, the P-Channel JFET voltage replica generator is connected to the drain terminal of the P-Channel transistor and the fixed voltage. The PNP BJT based voltage follower circuit includes (a) a PNP BJT transistor that includes a base terminal, a emitter terminal, and a collector terminal, the base terminal is connected to the input voltage Vin and (b) a PNP BJT voltage replica generator that includes one or more PNP BJT transistors, the PNP BJT voltage replica generator is connected to the collector terminal of the PNP BJT transistor and the fixed voltage.

In another aspect, a voltage follower circuit to mitigate gain loss caused by a finite output impedance of one or more transistors is provided. The voltage follower circuit includes a voltage follower circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit. The NMOS based voltage follower circuit includes (a) a first NMOS transistor that includes a first gate terminal, a first drain terminal, and a first source terminal, the first drain terminal is connected to the fixed voltage, (b) a second NMOS transistor that includes a second gate terminal, a second drain terminal, and a second source terminal, the second gate terminal is connected to an input voltage Vin, the second drain terminal is connected to the first source terminal, and the second source terminal is connected to a bias current source, and (c) a NMOS level shifter that is connected between the first gate terminal and the second gate terminal. The NMOS level shifter adds a voltage depending on the process corner, a supply voltage, and a temperature. The NPN BJT based voltage follower circuit includes (a) a first NPN BJT transistor that includes a first base terminal, a first collector terminal, and a first emitter terminal, the first collector terminal is connected to the fixed voltage, (b) a second NPN BJT transistor that includes a second base terminal, a second collector terminal, and a second emitter terminal, the second base terminal is connected to the input voltage Vin, the second collector terminal is connected to the first emitter terminal, and the emitter terminal is connected to the bias current source, and (c) a NPN BJT level shifter that is connected between the first base terminal and the second base terminal, the NPN BJT level shifter adds a voltage depending on the process corner, the supply voltage, and the temperature. The n-channel JFET based voltage follower circuit includes (a) a first n-channel JFET transistor that includes a first gate terminal, a first drain terminal, and a first source terminal, the first drain terminal is connected to the fixed voltage, (b) a second n-channel JFET transistor that includes a second gate terminal, a second drain terminal, and a second source terminal, the second gate terminal is connected to the input voltage Vin, the second drain terminal is connected to the first source terminal, and the second source terminal is connected to the bias current source, and (c) a n-channel JFET level shifter that is connected between the first gate terminal and the second gate terminal, the n-channel JFET level shifter adds a voltage depending on the process corner, the supply voltage, and the temperature. The PMOS based voltage follower circuit includes (a) a first PMOS transistor that includes a first gate terminal, a first source terminal, and a first drain terminal, the first gate terminal is connected to the input voltage Vin and the first source terminal is connected to the bias current source, (b) a second PMOS transistor that includes a second gate terminal, a second source terminal, and a second drain terminal, the second source terminal is connected to the first drain terminal and second drain terminal is connected to a ground terminal, and (c) a PMOS level shifter that is connected between the first gate terminal and the second gate terminal, the PMOS level shifter adds a voltage depending on the process corner, the supply voltage, and the temperature. The P-Channel JFET based voltage follower circuit includes (a) a first P-Channel JFET transistor that includes a first gate terminal, a first source terminal, and a first drain terminal, the first gate terminal is connected to the input voltage Vin and the first source terminal is connected to the bias current source, (b) a second P-Channel JFET transistor that includes a second gate terminal, a second source terminal, and a second drain terminal, the second source terminal is connected to the first drain terminal and the second drain terminal is connected to the ground terminal, and (c) a P-Channel JFET level shifter that is connected between the first gate terminal and the second gate terminal, the P-Channel JFET level shifter adds a voltage depending on the process corner, the supply voltage, and the temperature. The PNP BJT based voltage follower circuit includes (a) a first PNP BJT transistor that includes a first base terminal, a first emitter terminal, and a first collector terminal, the first base terminal is connected to the input voltage Vin and the first emitter terminal is connected to the bias current source, (b) a second PNP BJT transistor that comprises a second base terminal, a second emitter terminal, and a second collector terminal, the second emitter terminal is connected to the first collector terminal and the second collector terminal is connected to the ground terminal, and (c) a PNP BJT level shifter that is connected between the first base terminal and the second base terminal, the PNP BJT level shifter adds a voltage depending on the process corner, the supply voltage, and the temperature.

In yet another aspect, a voltage follower circuit to mitigate gain loss caused by a finite output impedance of one or more transistors is provided. The voltage follower circuit includes a voltage follower circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit. The NMOS based voltage follower circuit includes (a) a first NMOS transistor that includes a first gate terminal, a first drain terminal, and a first source terminal, the first gate terminal is connected to an input voltage Vin, the source terminal is connected to a bias current source, (b) a second NMOS transistor that includes a second gate terminal, a second drain terminal, and a second source terminal, the second gate terminal is connected to the input voltage Vin, the second drain terminal is connected to a fixed voltage, and the second source terminal is connected to said first drain terminal, (c) a third NMOS transistor, that includes a third gate terminal, a third drain terminal, and a third source terminal, the third gate terminal is connected to input voltage Vin, the third drain terminal is connected to the second source terminal, and the source terminal is connected to the bias current source, (d) a first NMOS level shifter, which is connected between the first gate terminal and the second gate terminal, and (e) a second NMOS level shifter, which is connected between the second gate terminal and the third gate terminal. The PMOS based voltage follower circuit includes (a) a first PMOS transistor that includes a first gate terminal, a first source terminal, and a first drain terminal, the first PMOS gate terminal is connected to the input voltage Vin and the PMOS source terminal is connected to a bias current source, (b) a second PMOS transistor that includes a second gate terminal, a second source terminal, and a second drain terminal, the second PMOS source terminal is connected to said first PMOS drain terminal and said second PMOS drain terminal is connected to a ground terminal, (c) a third PMOS transistor, which includes a third gate terminal, a third drain terminal, and a third source terminal, the third source terminal is connected to the second drain terminal, and the third drain terminal is connected to said ground terminal. (d) a first PMOS level shifter that is connected between the first gate terminal and the second gate terminal, and (e) a second PMOS level shifter that is connected between the second gate terminal and the third gate terminal. The NPN BJT based voltage follower circuit includes (a) a first NPN BJT transistor that includes a first base terminal, a first collector terminal, and a first emitter terminal. (b) a second NPN BJT transistor that includes a second base terminal, a second collector terminal, and a second emitter terminal, the first emitter terminal is connected to the second collector terminal, the second emitter terminal is connected to the bias current source, and the first collector terminal is connected to the fixed voltage, (c) a third NPN BJT transistor, which includes a third base terminal, a third collector terminal, and a third emitter terminal, the third base terminal is connected to the input voltage Vin, the third collector terminal is connected to the second emitter terminal of the second NPN BJT transistor, and the third emitter terminal is connected to said bias current source, (d) a first NPN BJT level shifter that is connected between the first base terminal and the second base terminal, and (e) a second NPN BJT level shifter that is connected between the second base terminal and the third base terminal. The n-channel JFET based voltage follower circuit includes (a) a first n-channel JFET transistor that includes a first gate terminal, a first drain terminal, and a first source terminal (b) a second n-channel JFET transistor that includes a second gate terminal, a second drain terminal, and a second source terminal, the first source terminal is connected to the second drain terminal, the second source terminal is connected to the bias current source and the first drain terminal is connected to the fixed voltage, (c) a third n-channel JFET transistor, which comprises a third gate terminal, a third drain terminal, and a third source terminal, the third gate terminal is connected to the input voltage Vin, the third drain terminal is connected to the second source terminal, and the third source terminal is connected to the bias current source, (d) a first n-channel JFET level shifter that is connected between the first gate terminal and the second gate terminal, and (e) a second n-channel JFET level shifter that is connected between the second gate terminal and the third gate terminal. The P-Channel JFET based voltage follower circuit includes (a) a first P-Channel JFET transistor that includes a first gate terminal, a first source terminal, and a first drain terminal, (b) a second P-Channel JFET transistor that includes a second gate terminal, a second source terminal, and a second drain terminal, the first source terminal is connected to the bias current source, the first drain terminal is connected to the second source terminal, and the second drain terminal is connected to the ground terminal. (c) a third P-Channel JFET, which includes a third gate terminal, a third source terminal, and a third drain terminal, the third drain terminal is connected to the ground terminal, and the third source terminal is connected to the second drain terminal, (d) a first P-Channel JFET level shifter that is connected between the first gate terminal and the second gate terminal, and (e) a second P-Channel JFET level shifter that is connected between the second gate terminal and the third gate terminal. The PNP BJT based voltage follower circuit includes (a) a first PNP BJT transistor that includes a first base terminal, a first emitter terminal, and a first collector terminal 2208A, (b) a second PNP BJT transistor that includes a second base terminal, a second emitter terminal, and a second collector terminal, the first collector terminal is connected to the second emitter terminal, the second collector terminal is connected to the fixed voltage and the first emitter terminal is connected to the bias current source, (c) a third PNP BJT transistor, which includes a third base terminal, a third emitter terminal, and a third collector terminal, the third emitter terminal is connected to the second collector terminal of the second PNP BJT terminal, and the third collector terminal is connected to said ground terminal, (d) a first PNP BJT level shifter that is connected between the first base terminal and to the second base terminal, and (e) a second PNP BJT level shifter that is connected between the second base terminal and to the third base terminal.

DETAILED DESCRIPTION OF THE DRAWINGS

Figure 3:
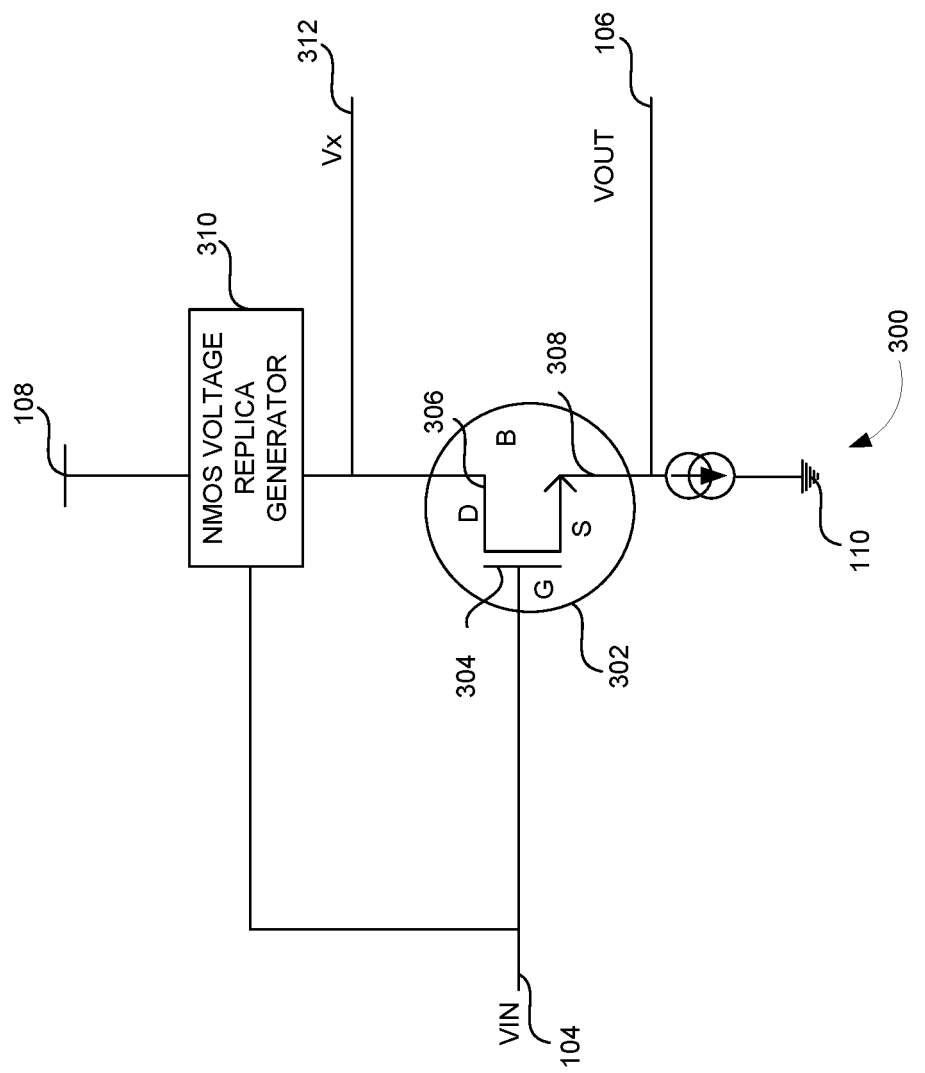
FIG. 3 illustrates a NMOS based voltage follower circuit according to an embodiment herein.

FIG. 3 illustrates a NMOS based voltage follower circuit 300 according to an embodiment herein. In one embodiment, the NMOS based voltage follower circuit 300 consists of a NMOS transistor 302 and a NMOS voltage replica generator 310 that includes one or more NMOS transistors. The NMOS transistor consists of a gate terminal 304, a drain terminal 306, and a source terminal 308. The gate terminal 304 is connected to the input voltage Vin 104 and the source terminal is connected to a bias current source. The other end of the bias current source is connected to the ground terminal 110. The NMOS voltage replica generator 310 is connected to the drain terminal 306 and to a fixed voltage 108. The NMOS voltage replica generator 310 generates a close replica of the input voltage Vin 104 at the drain terminal 306. The output voltage Vout 106 is the voltage at the source terminal 308.

Figure 4:
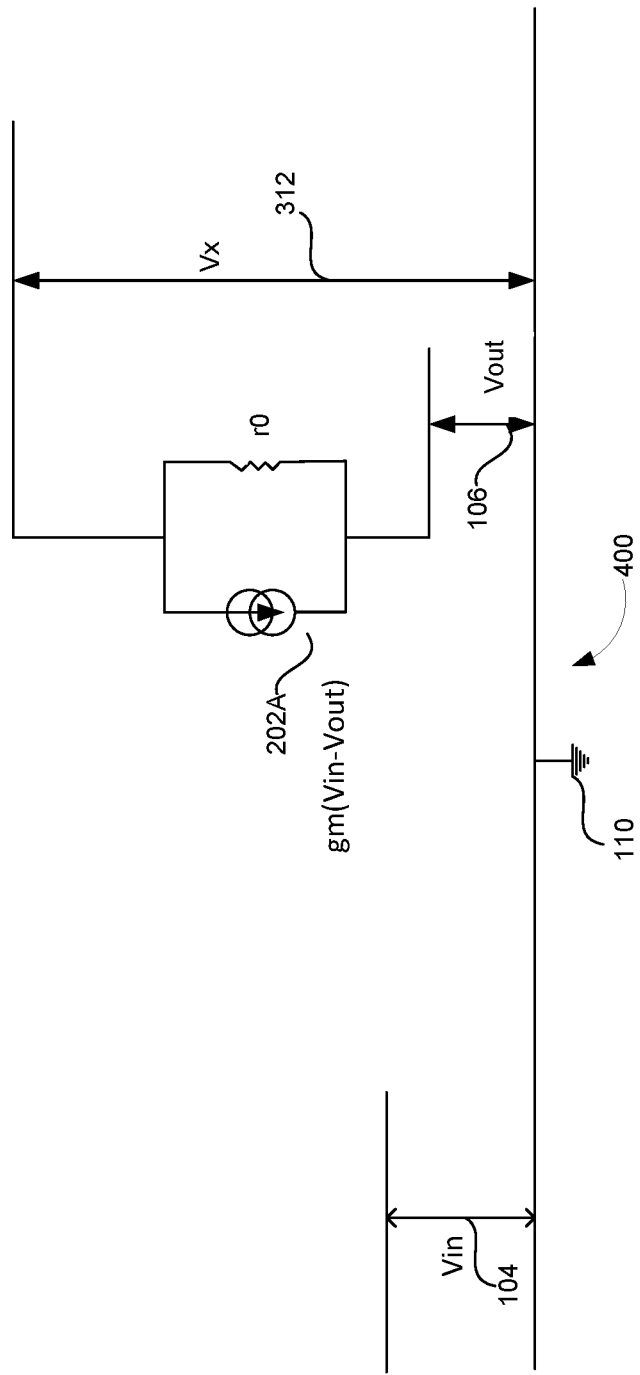
FIG. 4 illustrates a small signal model of the NMOS based voltage follower circuit of FIG. 3 according to an embodiment herein.

FIG. 4 illustrates a small signal model 400 of the NMOS based voltage replica generation circuit 300 according to an embodiment herein. The small signal model 400 is useful in calculating the gain of the NMOS based voltage replica generation circuit 300. In one embodiment, the small signal model 400 consists of an input voltage Vin 104, an output voltage Vout 106, a voltage controlled current source 202A, and a voltage replica Vx 312. The current source 202A models the transconductance gm of the NMOS transistor 302, and the resistance r0 models the output resistance of the NMOS transistor 302.

Applying the Kirchoff's Current Law at the output node, we obtain:

$$gm*(Vin-Vout)=(Vout-Vx)/r0$$

Solving for the output voltage Vout 106, we obtain $$Vout=Vin*gm*r0/(1+gm*r0)+Vx/(1+gm*r0)$$

If $Vx=alpha*Vin$ $$Vout=Vin*(alpha+gm*r0)/(1+gm*r0)$$

Therefore, $Gain=Vout/Vin=(alpha+gm*r0)/(1+gm*r0)$

From the above equation it is observed that when alpha is close to 1, the output voltage Vout 106 is close to the input voltage Vin 104.

Figure 5:
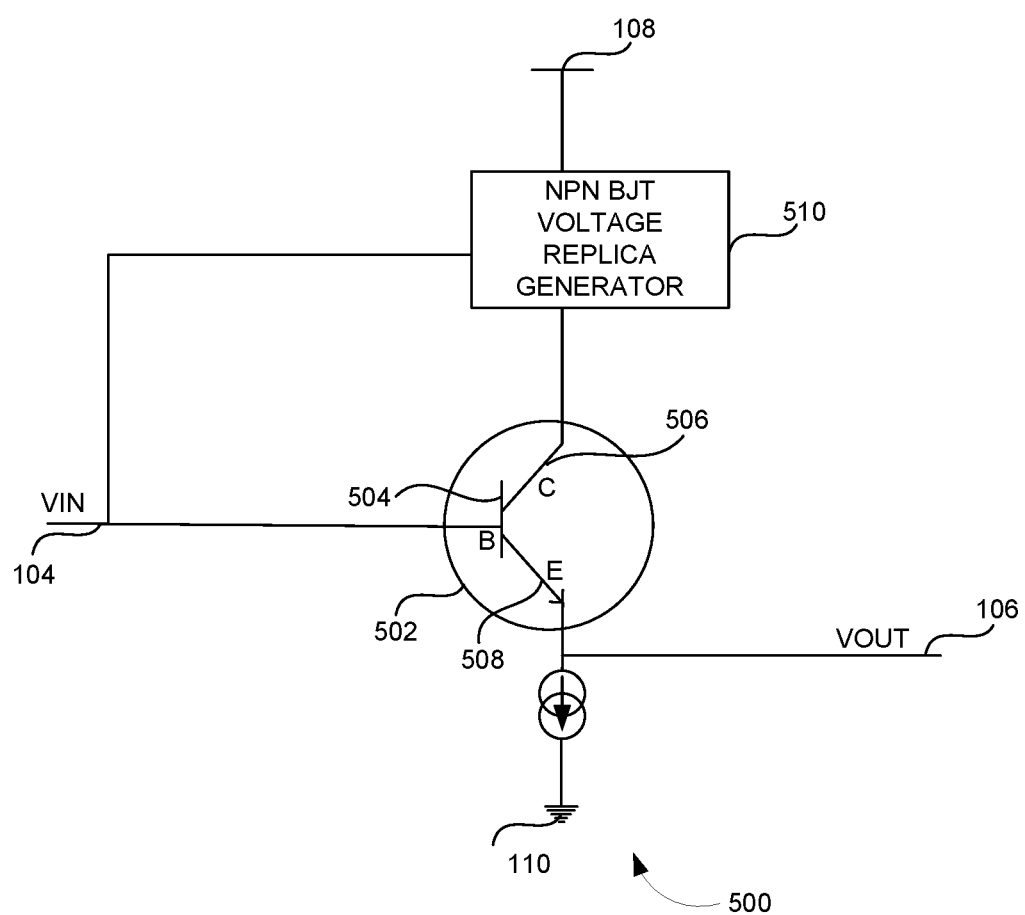
FIG. 5 illustrates a NPN BJT based voltage follower circuit according to an embodiment herein.

FIG. 5 illustrates a NPN BJT based voltage follower circuit 500 according to an embodiment herein. In one embodiment, the NPN BJT based voltage follower circuit 500 consists of a NPN BJT transistor 502 and a NPN BJT voltage replica generator 510 that includes one or more NPN BJT transistors. The NPN BJT transistor 502 consists of a base terminal 504, a emitter terminal 506, and a collector terminal 508. The base terminal 504 is connected to the input voltage Vin 104 and emitter terminal 506 is connected to a bias current source. The other end of the bias current source is connected to the ground terminal 110. The NPN BJT voltage replica generator 510 is connected to the collector terminal 506 and to the fixed voltage 108. The NPN BJT voltage replica generator 510 generates a close replica of the input voltage Vin 104 at the collector terminal 506. The output voltage Vout 106 is the voltage at the emitter terminal 506.

Figure 6:
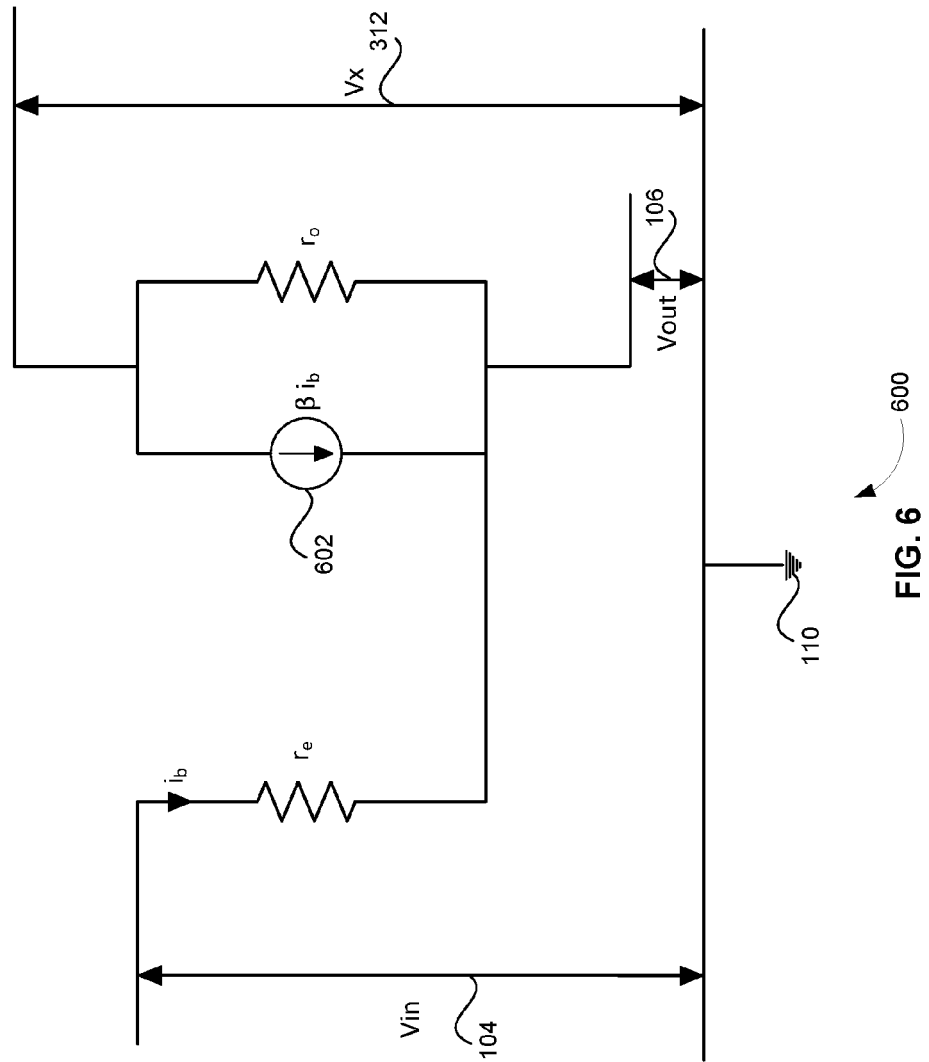
FIG. 6 illustrates a small signal model of the NPN BJT based voltage follower circuit of FIG. 5 according to an embodiment herein.

FIG. 6 illustrates a small signal model 600 of the NPN BJT based voltage replica generation circuit 500 according to an embodiment herein. The small signal model 600 is useful while calculating the gain of the NPN BJT based voltage replica generation circuit 500. The small signal model 600 consists of a current controlled current source 602 that models a gain factor (beta) of the NPN BJT transistor 502, a resistance re that models the input resistance of the NPN BJT transistor 502, and a resistance r0 that models the output resistance of the NPN BJT transistor 502. The gain of the NPN BJT based voltage replica generation circuit 500 is determined in accordance with equation Gain=Vout/Vin=(alpha+beta*r0/re)/(1+beta*r0/re), where alpha is the ratio of the voltage produced by the voltage replica generator Vx 312 and the input voltage Vin 104.

Figure 7:
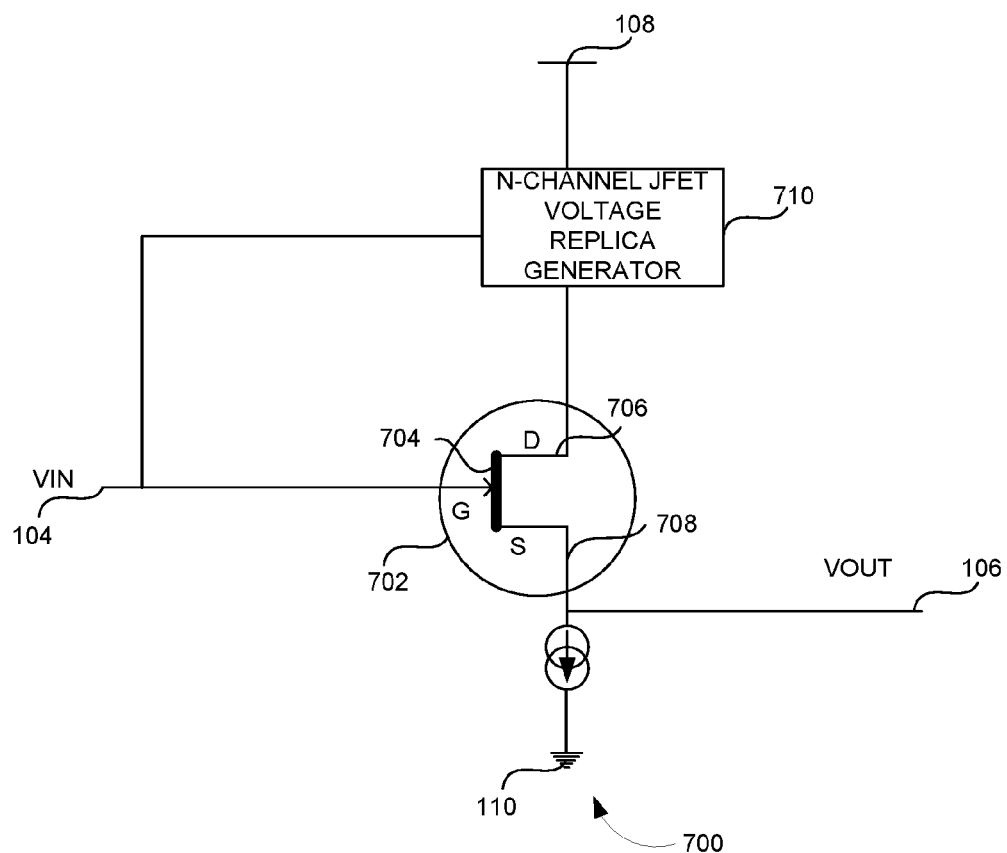
FIG. 7 illustrates a n-channel JFET based voltage follower circuit according to an embodiment herein.

FIG. 7 illustrates a n-channel JFET based voltage follower circuit 700 according to an embodiment herein. In one embodiment, the n-channel JFET based voltage replica generation circuit 700 includes a n-channel JFET transistor 702 and a n-channel JFET voltage replica generator 710 that includes one or more n-channel JFET transistors. The n-channel JFET transistor 702 consists of a gate terminal 702, a drain terminal 704, and a source terminal 708. The gate terminal 702 is connected to the input voltage Vin and the source terminal 708 is connected to the bias current source. The other end of the bias current source is connected to the ground terminal 108. The n-channel JFET voltage replica generator 710 is connected to the drain terminal 706 and to the fixed voltage 108. The n-channel; JFET voltage replica generator 710 generates a close replica of the input voltage Vin 104 at the drain terminal 706. The output voltage Vout 106 is the voltage at the source terminal 708. The small signal analysis for the n-channel JFET based source follower is exactly the same as the small signal analysis for the NMOS based source follower.

Figure 8:
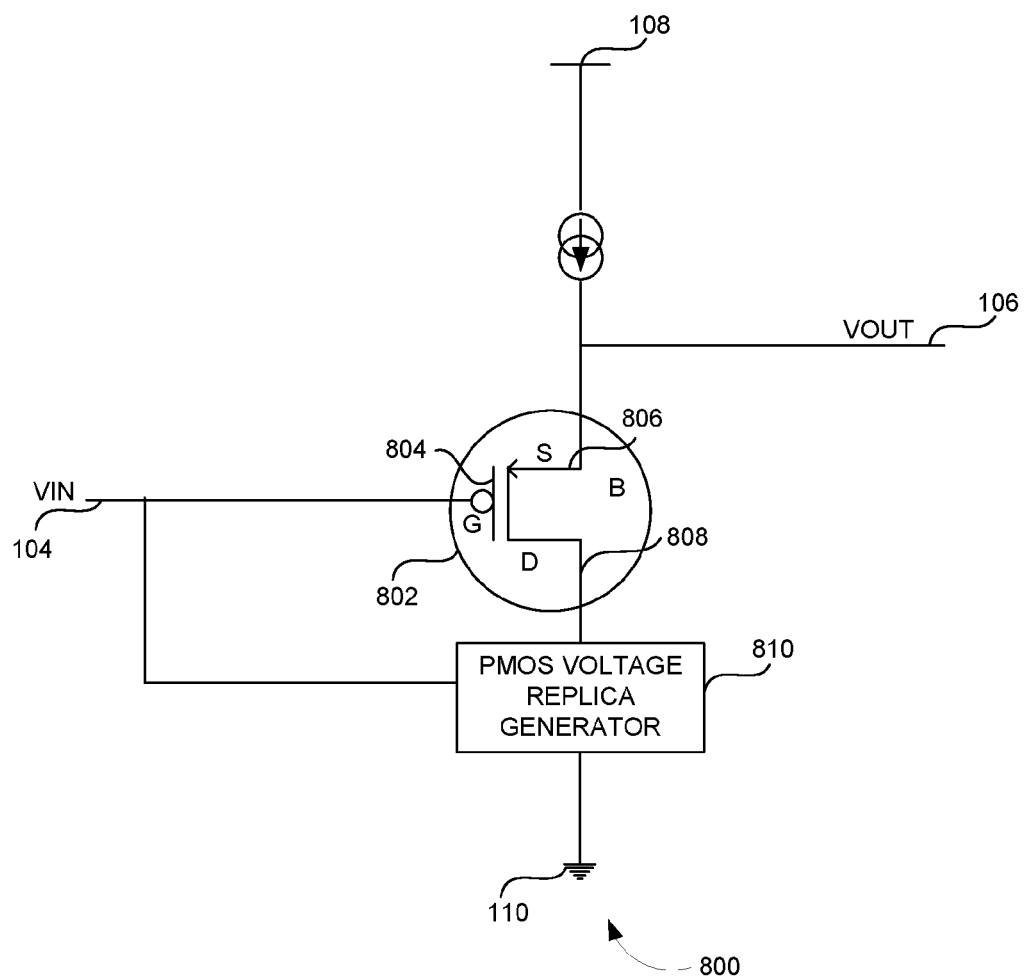
FIG. 8 illustrates a PMOS based voltage follower circuit according to an embodiment herein.

FIG. 8 illustrates a PMOS based voltage follower circuit 800 according to an embodiment herein. In one embodiment, the PMOS based voltage replica generation circuit 800 consists of a PMOS transistor 802 and a PMOS voltage replica generator 810 that includes one or more PMOS transistors. The PMOS transistor 802 consists of a gate terminal 804, a source terminal 806, and a drain terminal 808. The gate terminal 804 is connected to the input voltage Vin 104 and the source terminal is connected to the bias current source. The other end of the bias current source is connected to the fixed voltage 108. The PMOS replica voltage generator 810 is connected to the drain terminal 808 and the ground terminal 110. The PMOS voltage replica generator 810 generates a close replica of the input voltage Vin 104 at the drain terminal 808. The output voltage Vout 106 is the voltage at the source terminal 806.

Figure 9:
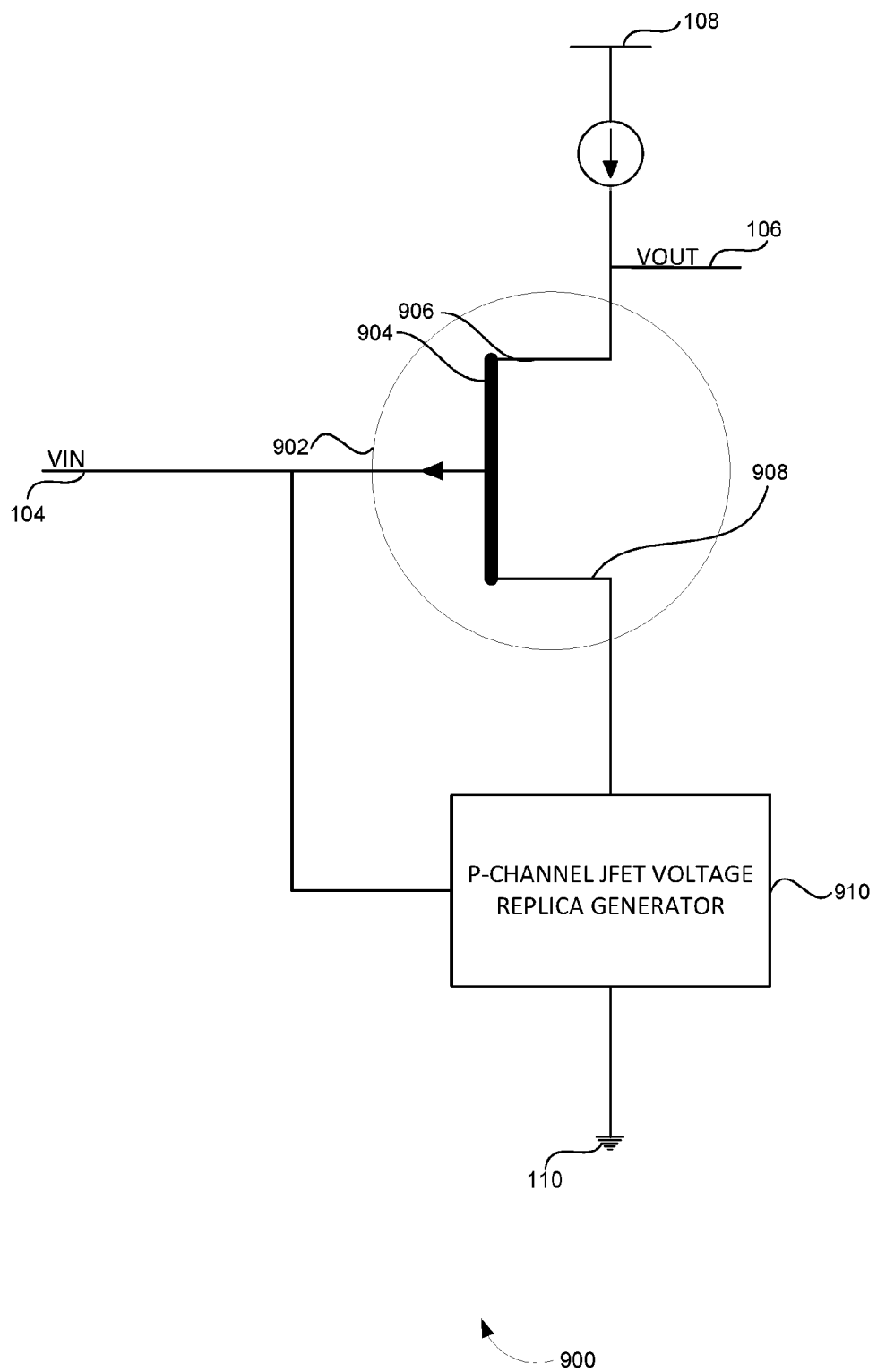
FIG. 9 illustrates a P-Channel JFET based voltage follower circuit according to an embodiment herein.

FIG. 9 illustrates a P-Channel JFET based voltage follower circuit 900 according to an embodiment herein. In one embodiment, the P-Channel JFET voltage replica generation circuit 900 consists of a P-Channel transistor 902 and a P-Channel JFET voltage replica generator 910 that includes one or more P-Channel transistors. The P-Channel transistor consists of a gate terminal 904, a source terminal 906, and a drain terminal 908. The gate terminal 904 is connected to the input voltage Vin 104 and the source terminal 906 is connected to the bias current source. The other end of the bias current source is connected to the fixed voltage 108. The P-Channel JFET voltage replica generator 910 is connected to the drain terminal 908 and to the ground terminal 110. The P-Channel voltage replica generator 910 generates a close replica of the input voltage Vin 104 at the drain terminal 908. The output voltage Vout 106 is the voltage at the source terminal 906.

Figure 10:
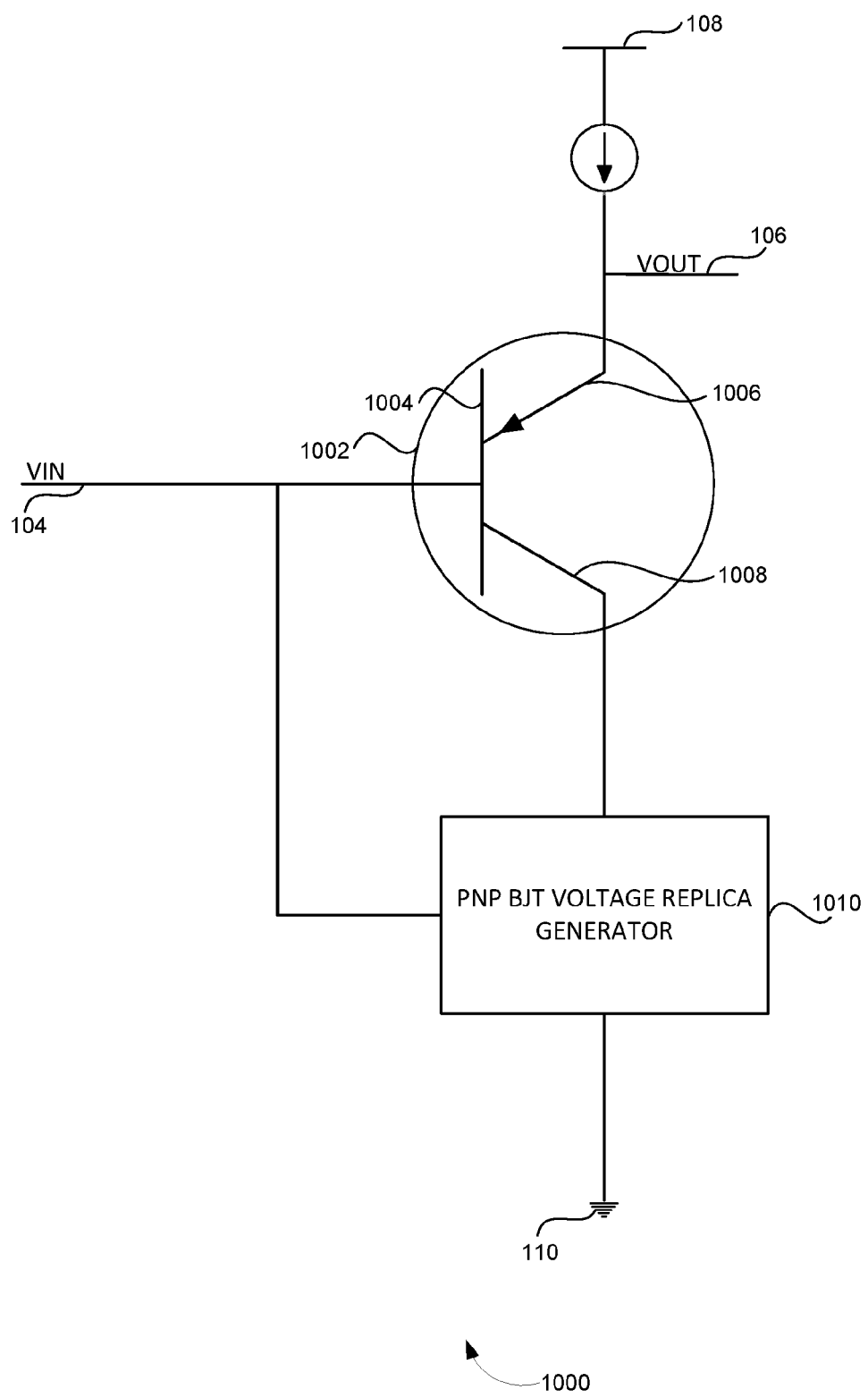
FIG. 10 illustrates a PNP BJT based voltage follower circuit according to an embodiment herein.

FIG. 10 illustrates a PNP BJT based voltage follower circuit 1000 according to an embodiment herein. In one embodiment, the PNP BJT based voltage replica generation circuit 1000 includes a PNP BJT transistor 1002 and a PNP BJT voltage replica generator 1010 that includes one or more PNP BJT transistors. The PNP BJT transistor 1002 consists of a base terminal 1004, a emitter terminal 1006, and a collector terminal 1008. The base terminal 1004 is connected to the input voltage Vin 104 and the emitter terminal 1006 is connected to the bias current source. The other end of the bias current source is connected to the fixed voltage 108. The PNP BJT voltage replica generator 1010 is connected to the collector terminal 1008 and the ground terminal 1010. The PNP BJT voltage replica generator generates a close replica of the input voltage Vin 104 at the collector terminal 1008. The output voltage Vout 106 is the voltage at the emitter terminal 1006.

Figure 11:
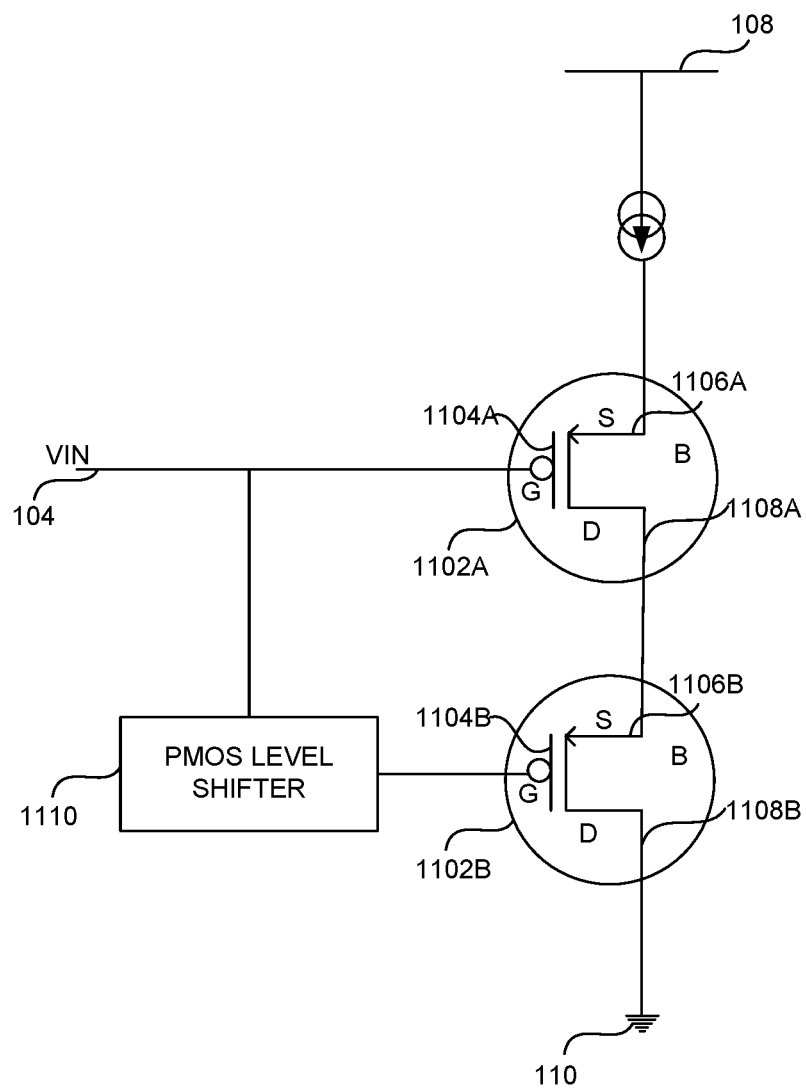
FIG. 11 illustrates a voltage follower circuit to mitigate gain loss that includes two PMOS transistors according to an embodiment herein.

FIG. 11 illustrates a voltage follower circuit 1100 to mitigate gain loss consisting two PMOS transistors according to an embodiment herein. In one embodiment, the voltage follower circuit 1100 consists of a first PMOS transistor 1102A, a second PMOS transistor 102B, and a PMOS level shifter 1110. The first PMOS transistor 1102A consists of a first gate terminal 1104A, a first source terminal 1106A, and a first drain terminal 1108A. The second PMOS transistor 1102B consists of a second gate terminal 1104B, a second source terminal 1106B, and a second drain terminal 1108B. The first source terminal 1106A is connected to the bias current source and the other end of the bias current source is connected to the fixed voltage 108. The first gate terminal 1104A is connected to the input voltage Vin 104. The first drain terminal 1108A is connected to the second source terminal 1106B and the second drain terminal 1108B is connected to the ground terminal 110. The PMOS level shifter 1110 is connected between the first gate terminal 1104A and the second gate terminal 1104B. The PMOS level shifter 1110 adds a DC voltage depending on the process corner, the supply voltage, and the temperature of the plurality of PMOS transistors.

Figure 12:
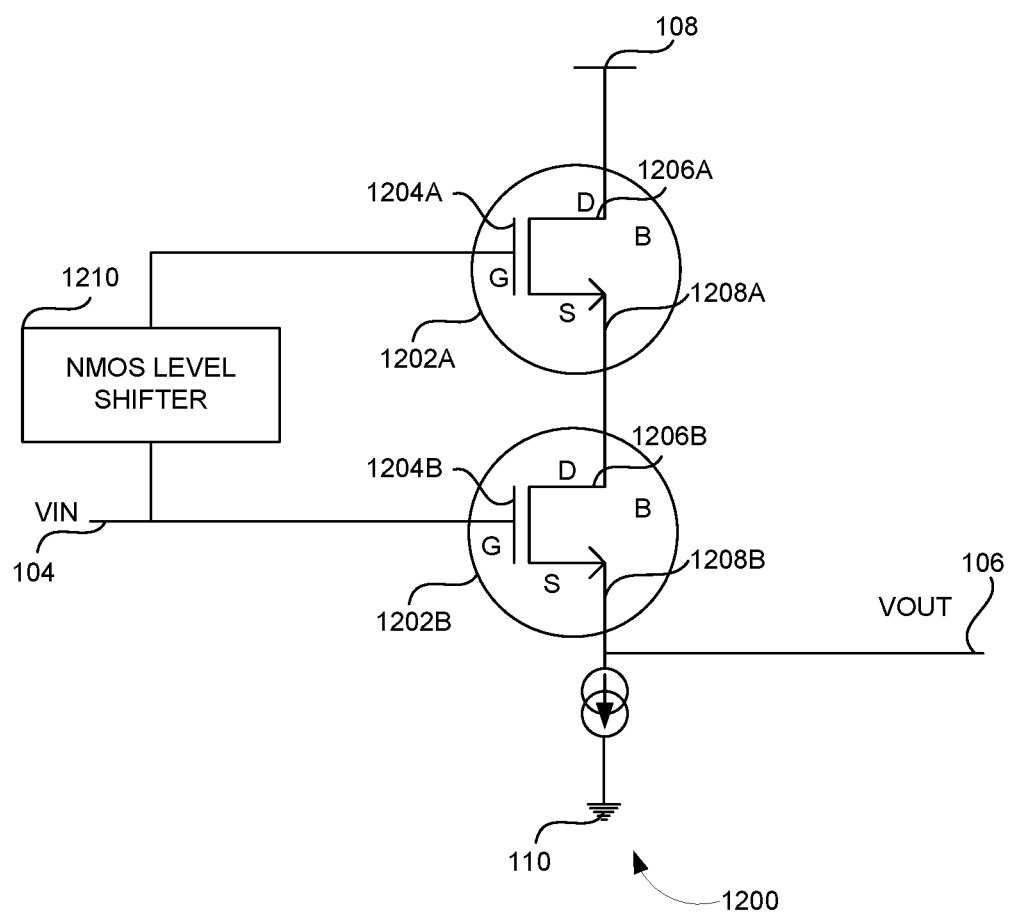
FIG. 12 illustrates a voltage follower circuit to mitigate gain loss that includes two NMOS transistors according to an embodiment herein.

FIG. 12 illustrates a voltage follower circuit 1200 to mitigate gain loss consisting of two NMOS transistors according to an embodiment herein. In one embodiment, the voltage follower circuit 1200 consists of a first NMOS transistor 1204A a second NMOS transistor 1204B. The first NMOS transistor 1202A includes a first gate terminal 1204A, a first drain terminal 1206A, and a first source terminal 1208A. The second NMOS transistor 1202B includes a second gate terminal 1204B, a second drain terminal 1206B, and a second source terminal 1208B. The first source terminal 1208A is connected to the second drain terminal 1206B. The input voltage Vin 104 is applied to the second gate terminal 1204B. The NMOS level shifter 1210 is used to add a DC voltage to the input voltage Vin 104. This level shifted input voltage is applied to the first gate terminal 1204A. In one embodiment, in absence of the NMOS level shifter 1210, if the W/L ratios of both transistors are similar, the drain to source voltage of the second NMOS transistor 1202B is close to zero forcing it to the triode region. The level shifted input voltage Vin 104 applied to the first gate terminal 1204A and ensures that the second NMOS transistor 1202B operates in the saturation region.

The output voltage Vout is the voltage at the second source terminal 1208B. The bias current source is connected from the output voltage Vout 106 to the ground terminal 110. In one embodiment, the first source terminal 1208A is connected to the second drain terminal 1206B. The gain of the voltage follower circuit 1200 is closer to unity because the first NMOS transistor 1202A provides a voltage close to input voltage Vin 104 at the first source terminal 1208A.

Figure 13:
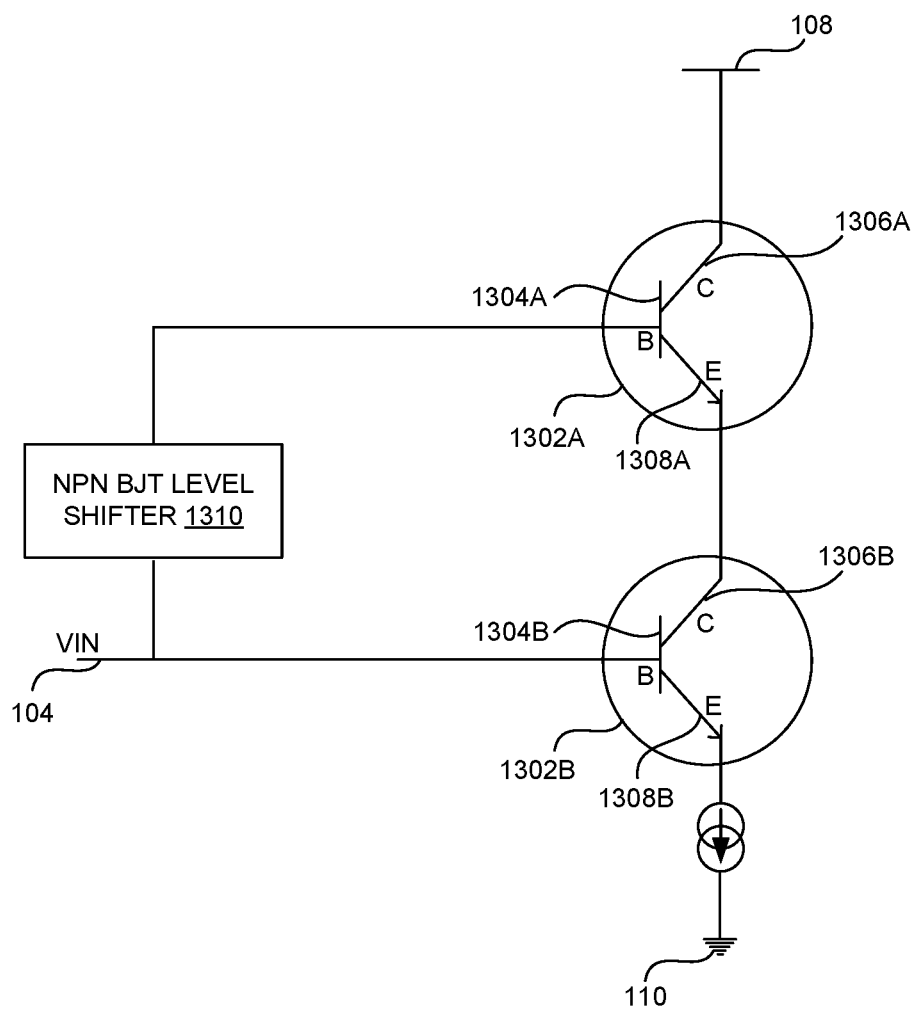
FIG. 13 illustrates a voltage follower circuit to mitigate gain loss that includes two NPN BJT transistors according to an embodiment herein.

FIG. 13 illustrates a voltage follower circuit 1300 to mitigate gain loss consisting of two NPN BJT transistors according to an embodiment herein. In one embodiment, the voltage follower circuit 1300 consists of a first NPN BJT transistor 1302A and a second NPN BJT transistor 1302B. The first NPN BJT transistor 1302A consists of a first base terminal 1304A, a first collector terminal 1306A, and a first emitter terminal 1308A. The second NPN BJT transistor 1302B consists of a second base terminal 1304B, a second collector terminal 1306B, and a second emitter terminal 1308B. The first collector terminal 1306A is connected to the fixed voltage 108, the first emitter terminal 1308A is connected to the second collector terminal 1306B, the second base terminal 1304B is connected to the input voltage Vin 104, and the second emitter terminal 1308B is connected to the bias current source. The other end of the bias current source is connected to the ground terminal 110. The NPN BJT level shifter 1310 is connected between the first base terminal 1304A and the second base terminal 1304B. The NPN BJT level shifter 1310 adds a DC voltage depending on the process corner, the supply voltage, and the temperature of the plurality of NPN BJT transistors.

Figure 14:
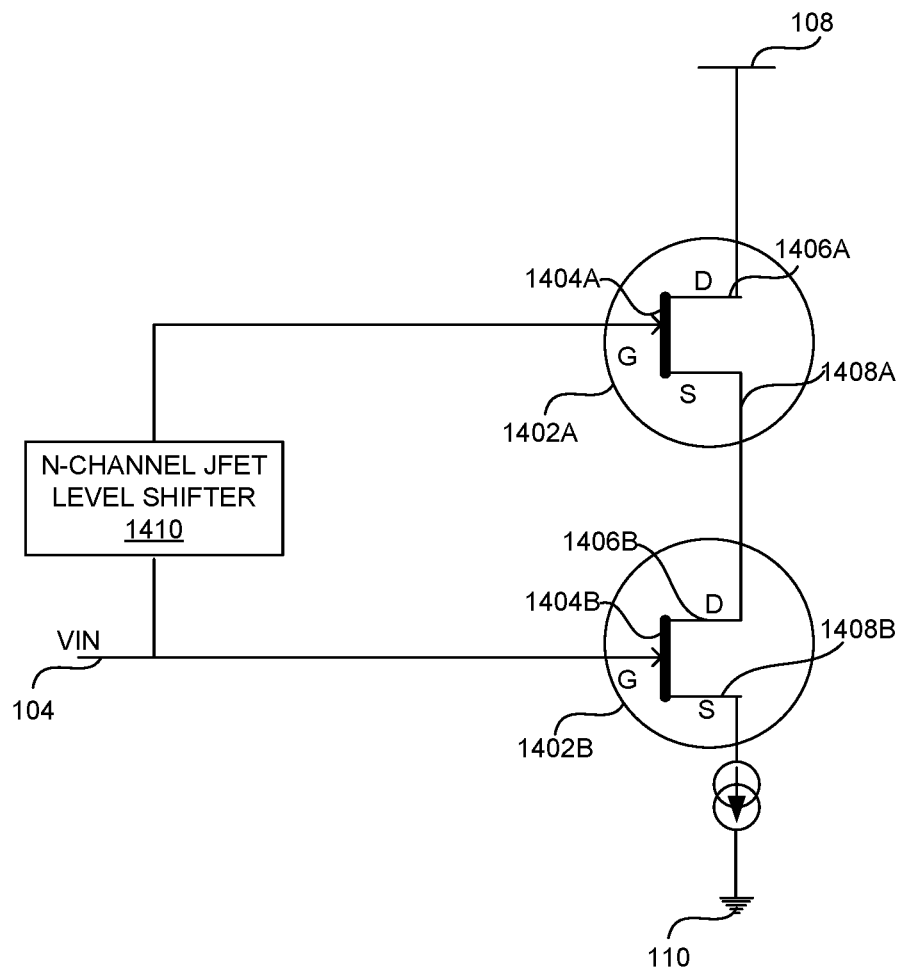
FIG. 14 illustrates a voltage follower circuit to mitigate gain loss that includes two n-channel JFET transistors according to an embodiment herein.

FIG. 14 illustrates a voltage follower circuit 1400 to mitigate gain loss consisting of two n-channel JFET transistors according to an embodiment herein. In one embodiment, the voltage follower circuit 1400 consists of a first n-channel JFET transistor 1402A and a second n-channel JFET transistor 1402B. The first n-channel JFET transistor 1402A consists of a first gate terminal 1404A, a first drain terminal 1406A, and a first collector terminal 1408A. The second n-channel JFET transistor 1402B consists of a second gate terminal 1404B, a second drain terminal 1406B, and a second source terminal 1408B. The first drain terminal 1406A is connected to the fixed voltage 108, the first source terminal 1408A is connected to the second drain terminal 1406B, the second gate terminal 1404B is connected to the input voltage Vin 104, and the second source terminal 1408B is connected to the bias current source. The other end of the bias current source is connected to the ground terminal 110. The n-channel JFET level shifter 1410 is connected to the first gate terminal 1404A and the second gate terminal 1404B. The n-channel JFET level shifter 1410 adds a DC voltage depending on the process corner, the supply voltage, and the temperature of the plurality of n-channel JFET transistors.

Figure 15:
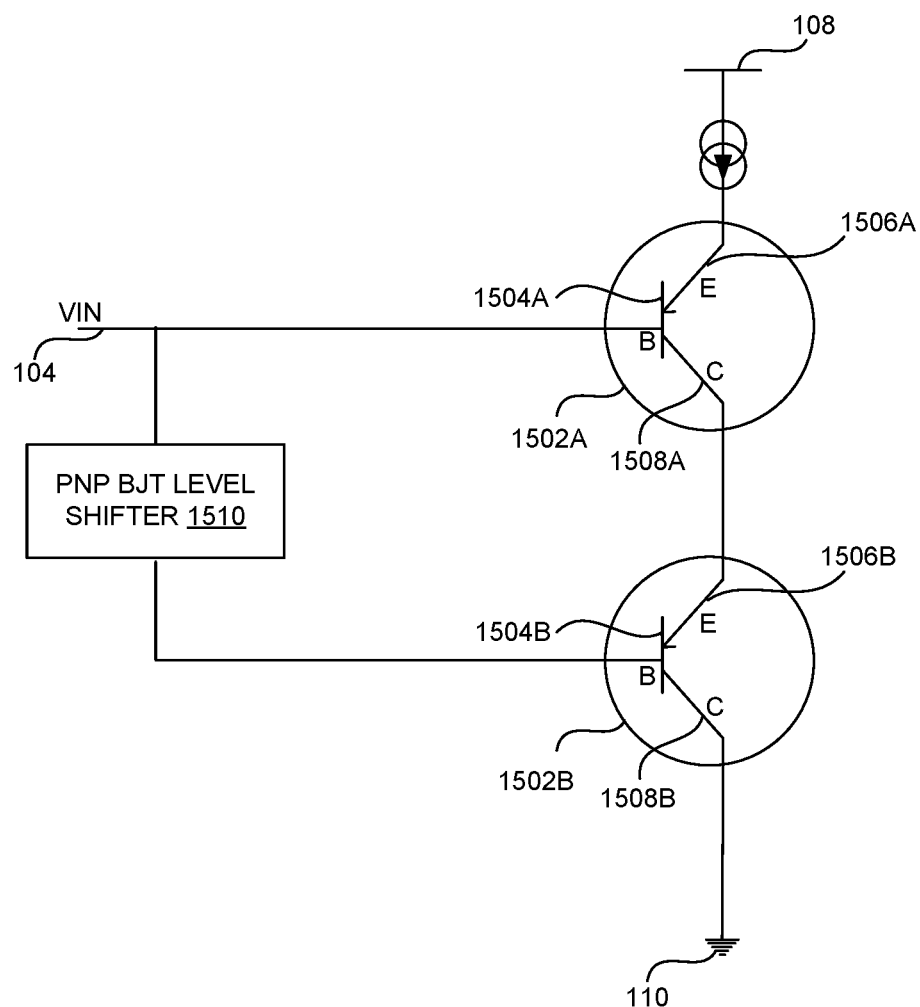
FIG. 15 illustrates a voltage follower circuit to mitigate gain loss that includes two PNP BJT transistors according to an embodiment herein.

FIG. 15 illustrates a voltage follower circuit 1500 to mitigate gain loss consisting of two PNP BJT transistors according to an embodiment herein. In one embodiment, the voltage follower circuit 1500 consists of a first PNP BJT transistor 1502A and a second PNP BJT transistor 1502B. The first PNP BJT transistor 1502A consists of a first base terminal 1504A, a first emitter terminal 1506A, and a first collector terminal 1508A. The second PNP BJT transistor 1502B consists of a second base terminal 1504B, a second emitter terminal 1506B, and a second emitter terminal 1508B. The first emitter terminal 1506A is connected to the bias current source, the first collector terminal 1508A to the second emitter terminal 1506B, the first base terminal 1504A is connected to the input voltage Vin 104, and the second collector terminal 1508B is connected to the ground terminal 110. The other end of the bias current source is connected to the fixed voltage 108. The PNP BJT level shifter 1510 is connected between the first base terminal 1504A and the second base terminal 1504B. The PNP BJT level shifter 1510 adds a DC voltage depending on the process corner, the supply voltage, and the temperature of the plurality of the PNP BJT transistors.

Figure 16:
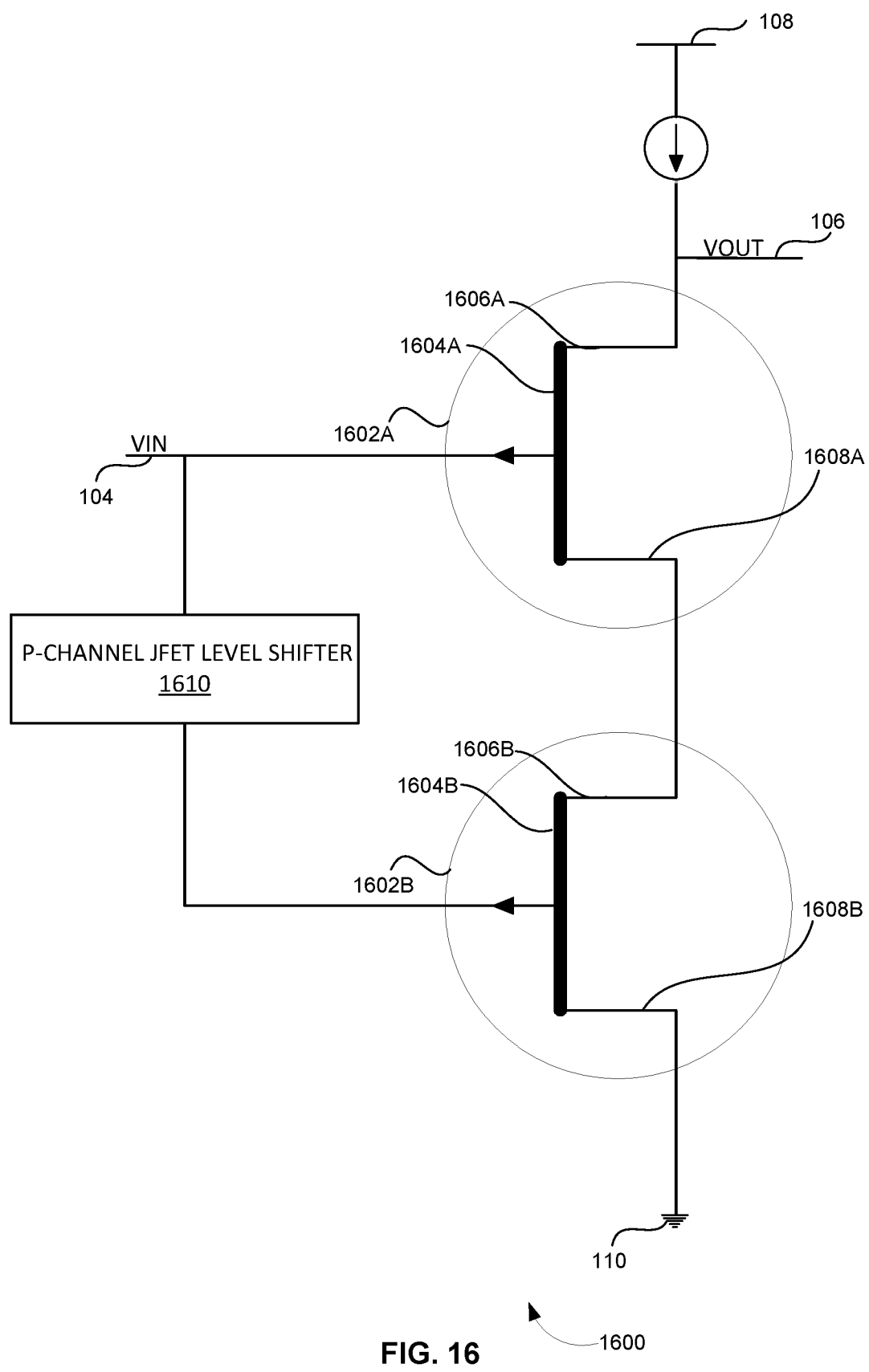
FIG. 16 illustrates a voltage follower circuit to mitigate gain loss that includes two P-Channel JFET transistors according to an embodiment herein.

FIG. 16 illustrates a voltage follower circuit 1600 to mitigate gain loss consisting of two P-Channel JFET transistors according to an embodiment herein. The voltage follower circuit 1600 consists of a first P-Channel transistor 1602A and a second P-Channel transistor 1602B. The first P-Channel transistor 1602A consists of a first gate terminal 1604A, a first source terminal 1606A, and a first drain terminal 1608A. The second P-Channel transistor 1602B consists of a second gate terminal 1604B, a second source terminal 1606B, and a second drain terminal 1608B. The first source terminal 1606A is connected to the bias current source, the first gate terminal 1604A is connected to the input voltage Vin 104, the first drain terminal 1608A is connected to the second source terminal 1606B, and the second drain terminal 1608B is connected to the ground terminal 110. The other end of the bias current source is connected to the fixed voltage 108. The P-Channel JFET level shifter 1610 is connected between the first gate terminal 1604A and the second gate terminal 1602B. The P-Channel level shifter 1610 adds a DC voltage depending on the process corner, the supply voltage, and the temperature of the plurality of the P-Channel JFET transistors.

Figure 17:
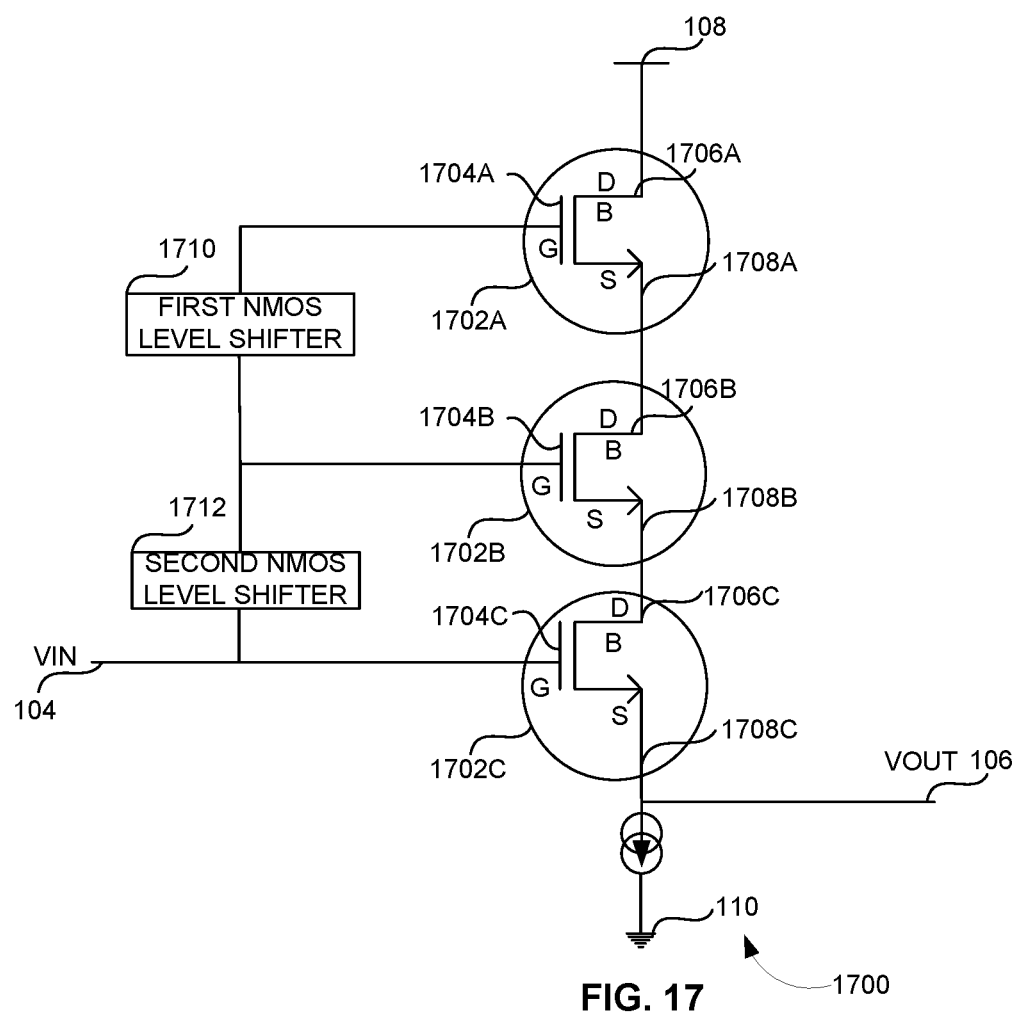
FIG. 17 illustrates a voltage follower circuit to mitigate gain loss that includes three NMOS transistors according to an embodiment herein.

FIG. 17 illustrates a voltage follower circuit 1700 to mitigate gain loss consisting of three NMOS transistors according to an embodiment herein. In one embodiment, the voltage follower circuit 1700 consists of a first NMOS transistor 1702A, a second NMOS transistor 1702B, and a third NMOS transistor 1702C, a first NMOS level shifter 1710, and a second NMOS level shifter 1712. The first NMOS transistor 1702A includes a first gate terminal 1704A, a first drain terminal 1706A, and a first source terminal 1708A. The second NMOS transistor 1702B includes a second gate terminal 1704B, a second drain terminal 1706B, and a second source terminal 1708B. The third NMOS transistor 1702C includes a third gate terminal 1704C, a third drain terminal 1706C, and a third source terminal 1708C. The first drain terminal 1706A is connected to the fixed voltage 108, the first source terminal 1708A is connected to the second drain terminal 1706B, the second source terminal 1708B is connected to the third drain terminal 1706C, the third gate terminal 1704C is connected to the input voltage Vin 104, and the third source terminal 1708C is connected to the bias current source. The other end of the bias current source is connected to the ground terminal 110. The first NMOS level shifter 1710 is connected between the first gate terminal 1704A and the second gate terminal 1704B. The second NMOS level shifter 1712 is connected between the second gate terminal 1704B and the third gate terminal 1704C.

Using small signal analysis, the gain and the input capacitance of the voltage follower circuit 1700 is computed based on the following:

$$\text{Gain} = (gm1*r01 + gm2*r02 + gm3*r03 + gm1*gm2*r01*r02 + gm1*gm3*r01*r03 + gm2*gm3*r02*r03 + gm1*gm2*gm3*r01*r02*r03)/((1+gm1*r01)*(1+gm2*r02)*(1+gm3*r03))$$

Where gm1 denotes the transconductance of the first NMOS transistor 1702A, gm2 denotes the transconductance of the second NMOS transistor 1702B, and gm3 denotes the transconductance of the third NMOS transistor 1702C. Where ro1 denotes the output resistance of the first NMOS transistor 1702A, ro2 denotes the output resistance of the second NMOS transistor 1702B, and r03 denotes the output resistance of the third NMOS transistor 1702C.

For gm1*r01=gm2*r02=gm3*r03=10, Gain=1330/1331=0.999249

The input capacitance Cin is given by:

$$Cin=Cgd1+(Cgs1+Cgd2)*(1-gm1*r01/(1+gm1*r01))+(Cgs2+Cgd3)*(1-((gm1*r01+gm2*r02+gm1*gm2*r01*r02)/((1+gm1*r01)*(1+gm2*r02))))+Cgs3*(1-(gm1*r01+gm2*r02+gm3*r03+gm1*gm2*r01*r02+gm1*gm3*r01*r03+gm2*gm3*r02*r03+gm1*gm2*gm3*r01*r02*r03)/((1+gm1*r01)*(1+gm2*r02)*(1+gm3*r03)))$$

For Cgd1=Cgd2=Cgd3=C and Cgs1=Cgs2=Cgs3=−2*C, Cin=1.299*C

It is observed that the gain in the voltage follower circuit 1700 is greater when compared to the gain of the voltage follower circuit 1200. In various embodiments, using multiple transistors will lead to a gain closer to 1 with negligible increase in input capacitance.

Figure 18:
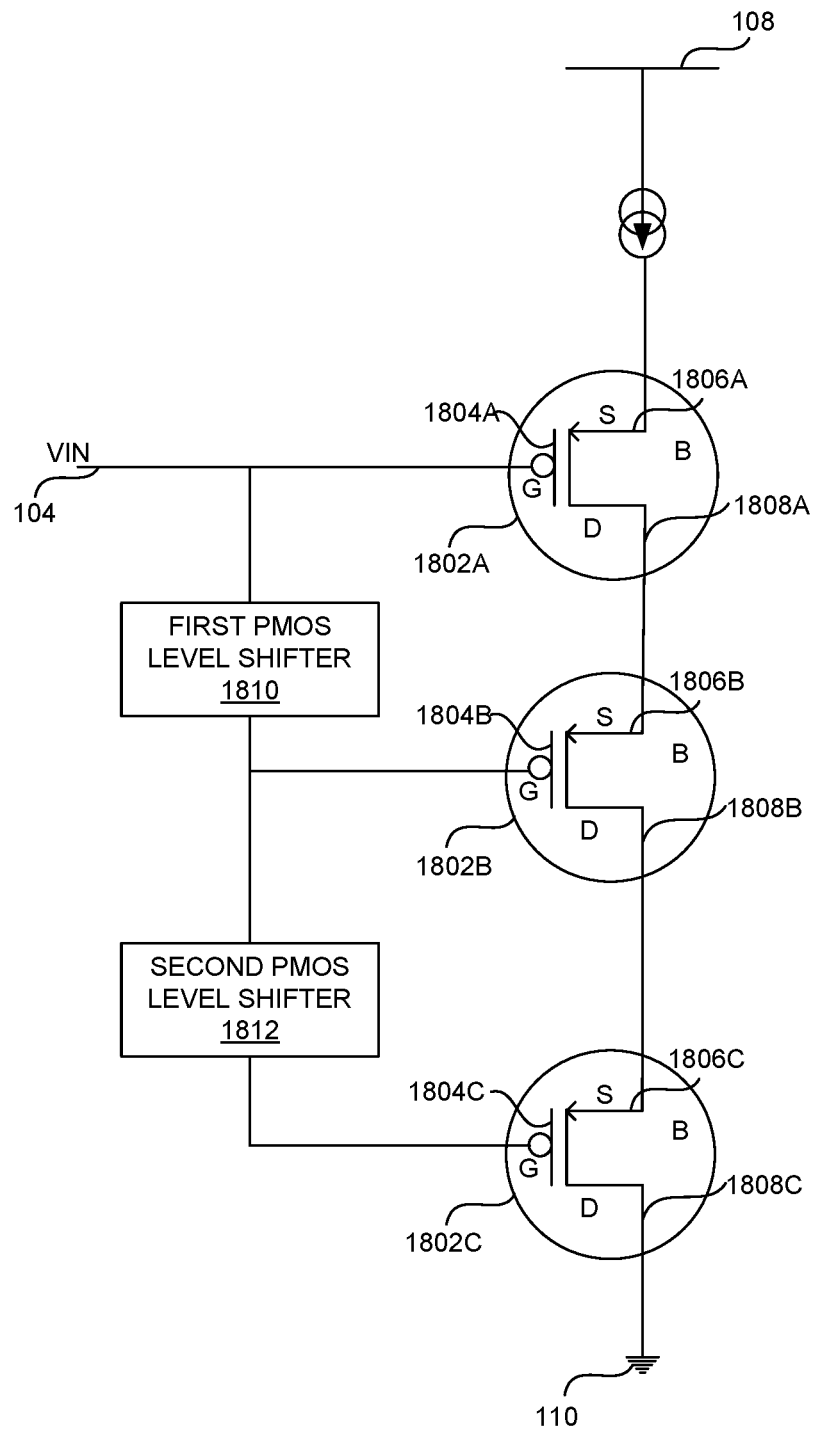
FIG. 18 illustrates a voltage follower circuit to mitigate gain loss that includes three PMOS transistors according to an embodiment herein.

FIG. 18 illustrates a voltage follower circuit 1800 to mitigate gain loss consisting of three PMOS transistors according to an embodiment herein. In one embodiment, the voltage follower circuit 1800 consists of a first PMOS transistor 1802A, a second PMOS transistor 1802B, and a third PMOS transistor 1802C. The first PMOS transistor 1802A includes a first gate terminal 1804A, a first source terminal 1806A, and a first drain terminal 1808A. The second PMOS transistor 1802B includes a second gate terminal 1804B, a second source terminal 1806B, and a second drain terminal 1808B. The third PMOS transistor 1802C includes a third gate terminal 1804C, a third source terminal 1806C, and a third drain terminal 1808C. The first source terminal 1806A is connected to the bias current source, the first gate terminal 1804A is connected to the input voltage Vin 104, the first drain terminal 1808A is connected to the second source terminal 1806B, the second drain terminal 1808B is connected to the third source terminal 1806C, and the third drain terminal 1808C is connected to the ground terminal 110. The first PMOS level shifter 1810 is connected between the first gate terminal 1804A and the second gate terminal 1804B. The second PMOS level shifter 1812 is connected between the second gate terminal 1804B and to the third gate terminal 1804C.

Figure 19:
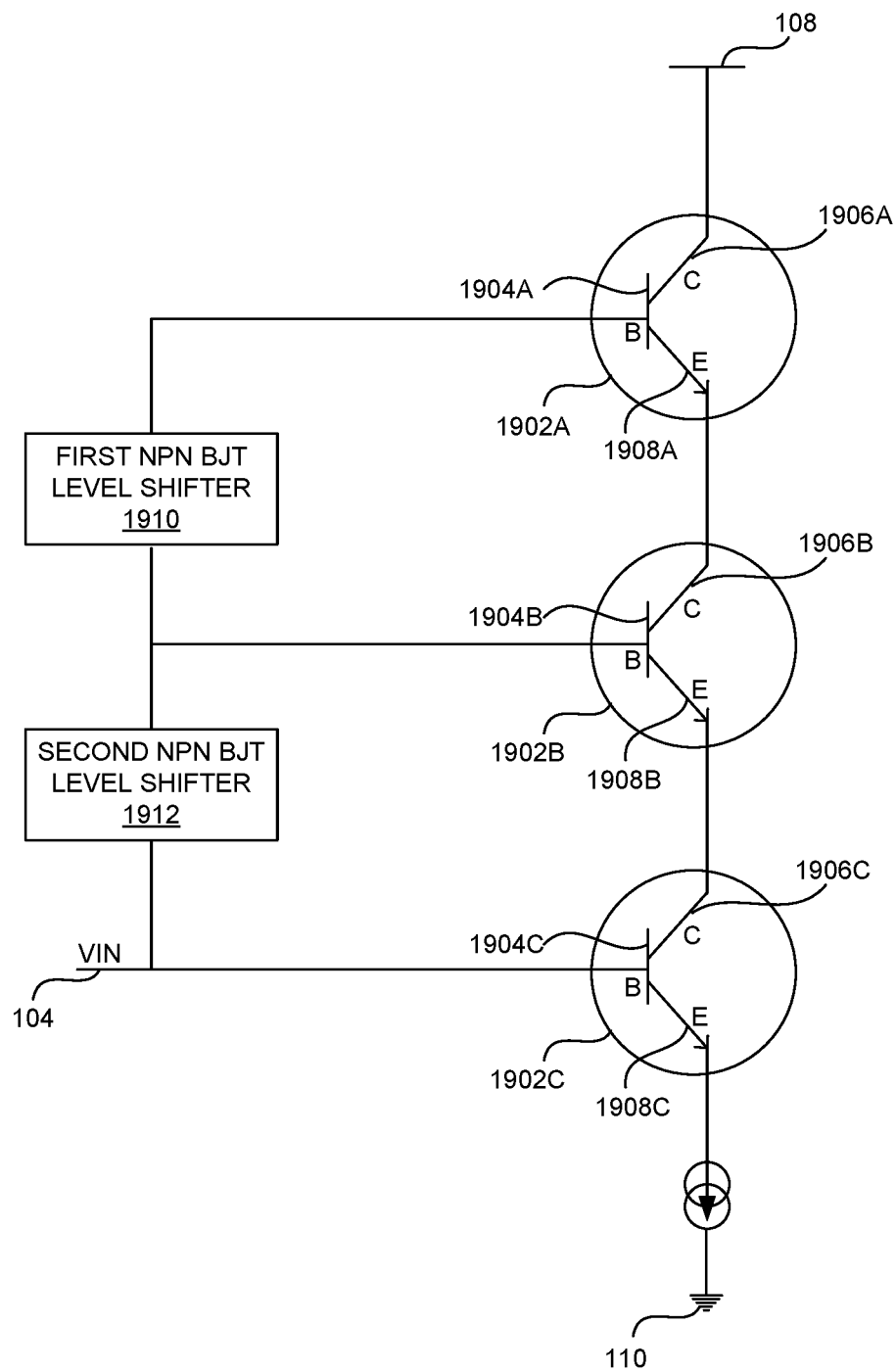
FIG. 19 illustrates a voltage follower circuit to mitigate gain loss that includes three NPN BJT transistors according to an embodiment herein.

FIG. 19 illustrates a voltage follower circuit 1900 to mitigate gain loss consisting of three NPN BJT transistors according to an embodiment herein. In one embodiment, the voltage follower circuit 1900 consists of a first NPN BJT transistor 1902A, a second NPN BJT transistor 1902B, and a third NPN BJT transistor 1902C. The first NPN BJT transistor 1902A includes a first base terminal 1904A, a first collector terminal 1906A, and a first emitter terminal 1908A. The second NPN BJT transistor 1902B includes a second base terminal 1904B, a second collector terminal 1906B, and a second emitter terminal 1908B. The third NPN BJT transistor 902C includes a third base terminal 1904C, a third collector terminal 1906C, and a third emitter terminal 1908C. The first collector terminal 1906A is connected to the fixed voltage 108, the first emitter terminal 1908A is connected to the second collector terminal 1906B, the second emitter terminal 1908C is connected to the third collector terminal 1906C, the third base terminal 1904C is connected to the input voltage Vin 104, and the third emitter terminal 1908C is connected to the bias current source. The other end of the bias current source is connected to the ground terminal 110. The first NPN BJT level shifter 1910 is connected between the first base terminal 1904A and the second base terminal 1904B. The second NPN BJT level shifter 1912 is connected between the second base terminal 1904B and the third base terminal 1904C.

Figure 20:
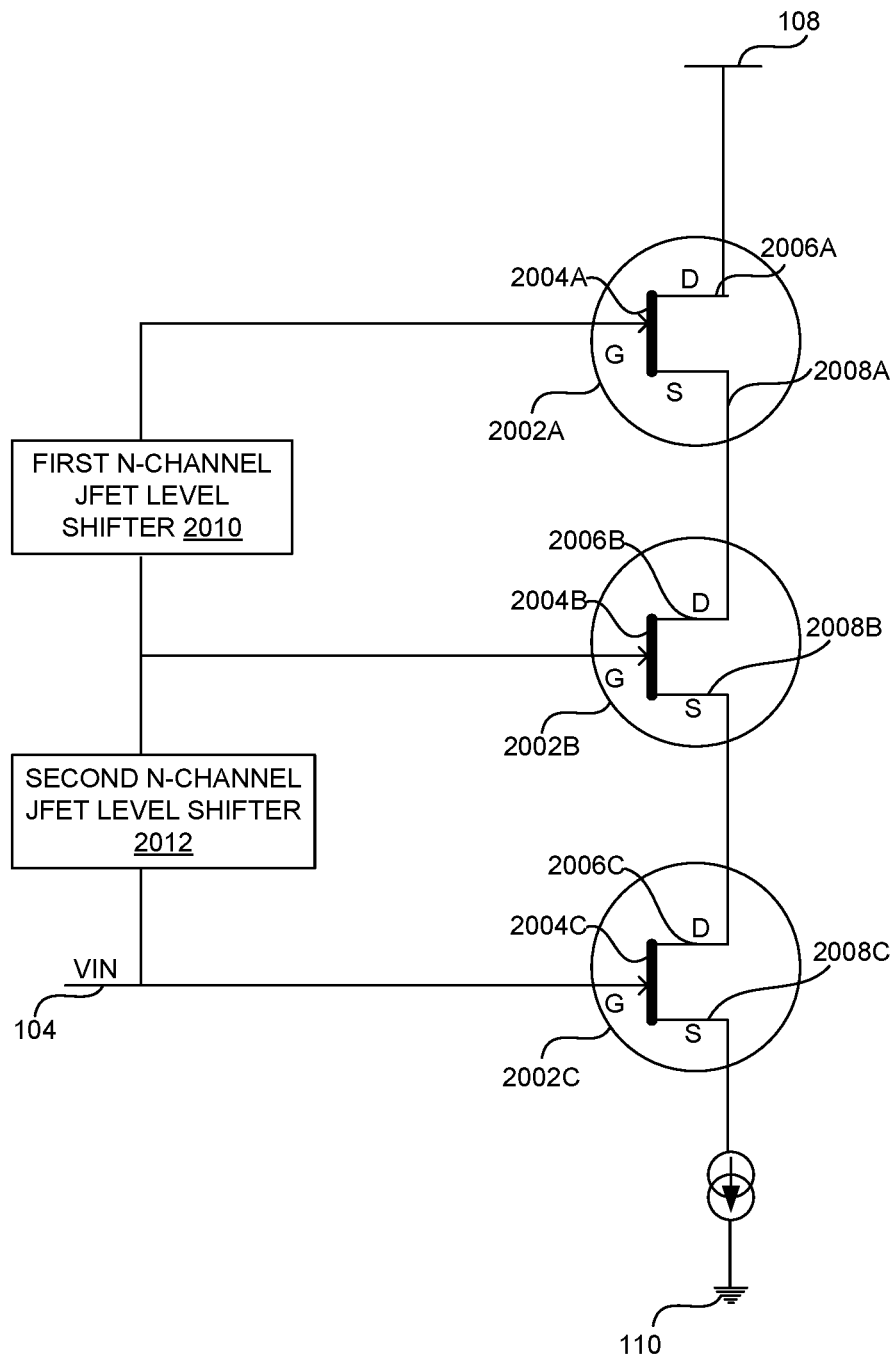
FIG. 20 illustrates a voltage follower circuit to mitigate gain loss that includes three n-channel JFET transistors according to an embodiment herein.

FIG. 20 illustrates a voltage follower circuit 2000 to mitigate gain loss consisting of three n-channel JFET transistors according to an embodiment herein. In one embodiment, the voltage follower circuit 2000 consists of a first n-channel JFET transistor 2002A, a second n-channel JFET transistor 2002B, and a third n-channel JFET transistor 2002C. The first n-channel JFET transistor 2002A consists of a first gate terminal 2004A, a first drain terminal 2006A, and a first source terminal 2008A. The second n-channel JFET transistor 2002B consists of a second gate terminal 2004B, a second drain terminal 2006B, and a second source terminal 2008B. The third n-channel JFET transistor 2002C consists of a third gate terminal 2004C, a third drain terminal 2006C, and a third source terminal 2008C. The first drain terminal 2006A is connected to the fixed voltage 108, the first source terminal 2006C is connected to the second drain terminal 2006B, the second source terminal 2008B is connected to the third drain terminal 2006C, the third gate terminal 2004C is connected to the input voltage Vin 104, and the third source terminal 2008C is connected to the bias current source. The other end of the bias current source is connected to the ground terminal 110. The first n-channel JFET level shifter 2010 is connected between the first gate terminal 2004A and the second gate terminal 2004B. The second n-channel JFET level shifter 2012 is connected between the second gate terminal 2004B and the third gate terminal 2004C.

Figure 21:
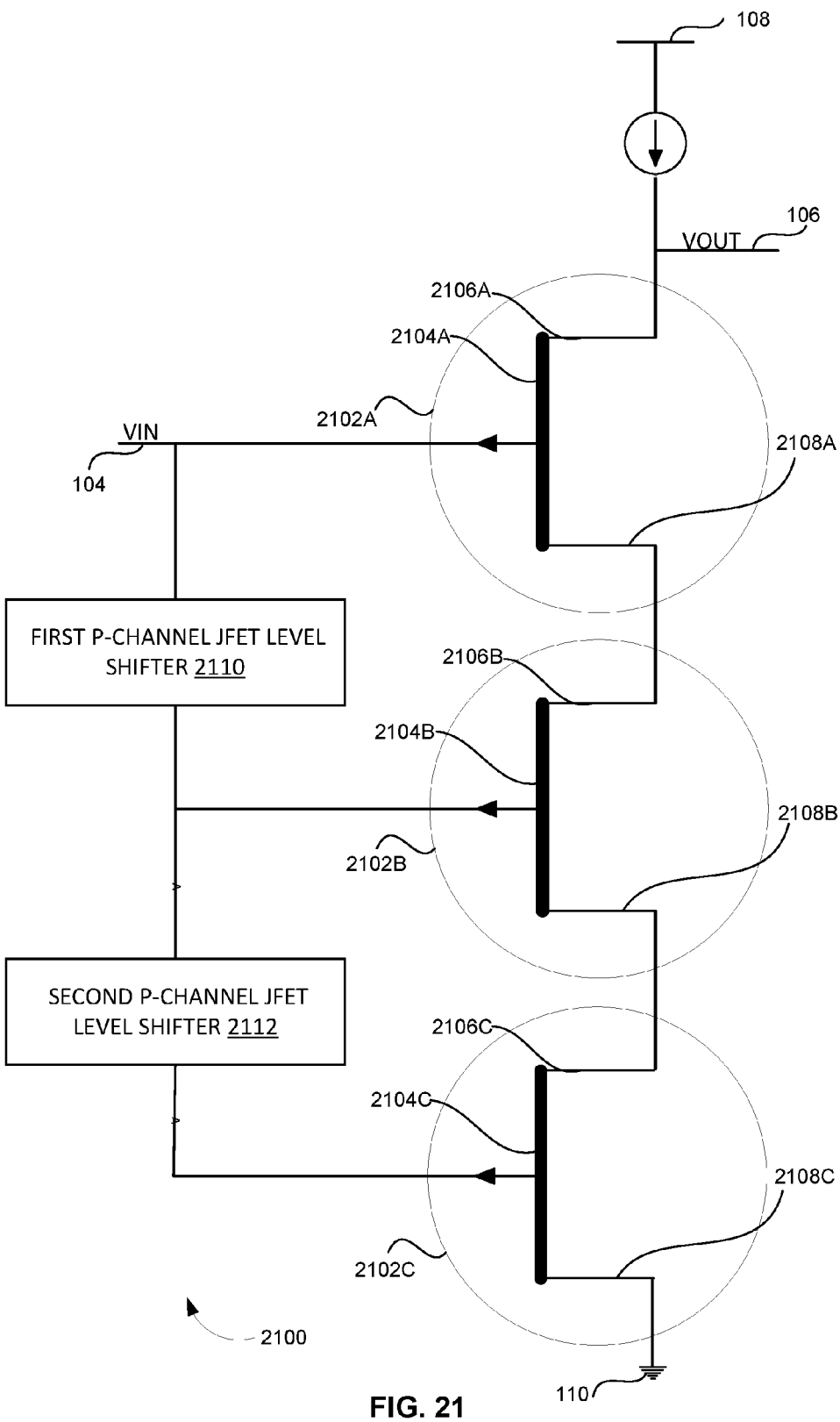
FIG. 21 illustrates a voltage follower circuit to mitigate gain loss that includes three P-Channel JFET transistors according to an embodiment herein.

FIG. 21 illustrates a voltage follower circuit 2100 to mitigate gain loss consisting of three P-Channel JFET transistors according to an embodiment herein. In one embodiment, the voltage follower circuit 2100 further consists of a first P-Channel transistor 2102A, a second P-Channel transistor 2102B, and a third P-Channel transistor 2102C. The first P-Channel transistor 2102A consists of a first gate terminal 2104A, a first source terminal 2106A, and a first drain terminal 2108A. The second P-Channel transistor 2102A consists of a second gate terminal 2104B, a second source terminal 2106B, and a second drain terminal 2108B. The third P-Channel transistor 2102C consists of a third gate terminal 2104C, a third source terminal 2106C, and a third drain terminal 2108C. The first source terminal 2106A is connected to the bias current source, the first gate terminal 2104A is connected to the input voltage Vin 104, the first drain terminal 2108A is connected to the second source terminal 2106B, the second drain terminal 2108B is connected to the third source terminal 2106C, and the third drain terminal 2108C is connected to the ground terminal 110. The other end of the bias current source is connected to the fixed voltage 110. The first P-Channel JFET level shifter 2110 is connected between the first gate terminal 2104A and to the second gate terminal 2104B. The second P-Channel JFET level shifter 2112 is connected between the second gate terminal 2104B and the third gate terminal 2104C.

Figure 22:
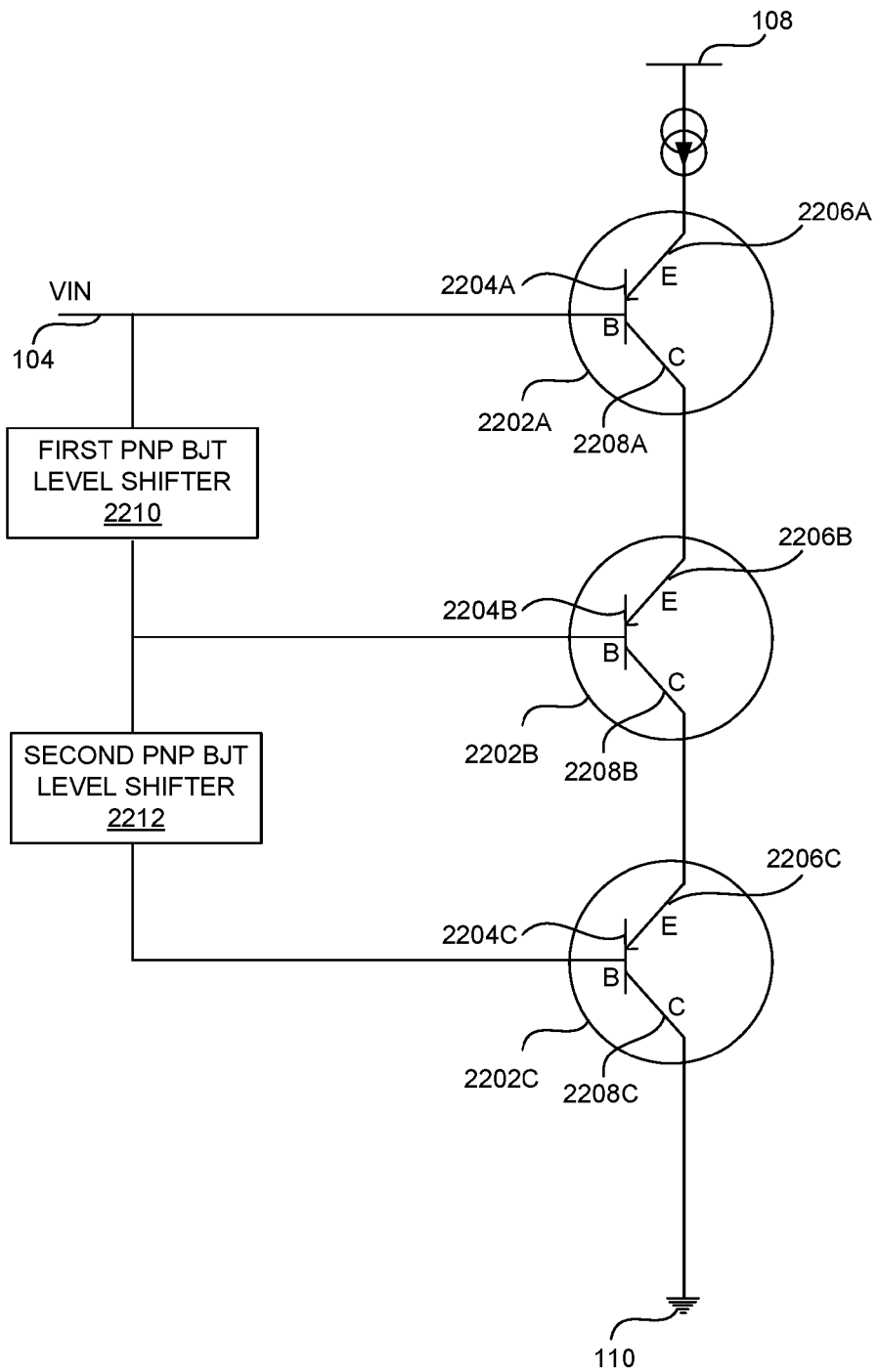
FIG. 22 illustrates a voltage follower circuit to mitigate gain loss that includes three PNP BJT transistors according to an embodiment herein.

FIG. 22 illustrates a voltage follower circuit 2200 to mitigate gain loss consisting of three PNP BJT transistors according to an embodiment herein. In one embodiment, the voltage follower circuit 2200 consists of a first PNP BJT transistor 2202A, a second PNP BJT transistor 2202B, and a third PNP BJT transistor 2202C. The first PNP BJT transistor 2202A consists of a first base terminal 2204A, a first emitter terminal 2206A, and a first collector terminal 2208A. The second PNP BJT transistor 2202B consists of a second base terminal 2204B, a second emitter terminal 2206B, and a second collector terminal 2208B. The third PNP BJT transistor 2202C consists of a third base terminal 2204C, a third emitter terminal 2206C, and a third collector terminal 2208C. The first emitter terminal 1006A is connected to the bias current source, the first collector terminal 1008A is connected to the second emitter terminal 2206B, the second collector terminal 2208B is connected to the third emitter terminal 2206C, the first base terminal 2204A is connected to the input voltage Vin 104, and the third collector terminal 2208C is connected to the ground terminal 110. The other end of the bias current source is connected to the fixed voltage 108. The first PNP BJT level shifter 2210 is connected between the first base terminal 2204A and to the second base terminal 2204B. The second PNP BJT level shifter 2212 is connected between the second base terminal 2204B and to the third base terminal 2204C.

Figure 23:
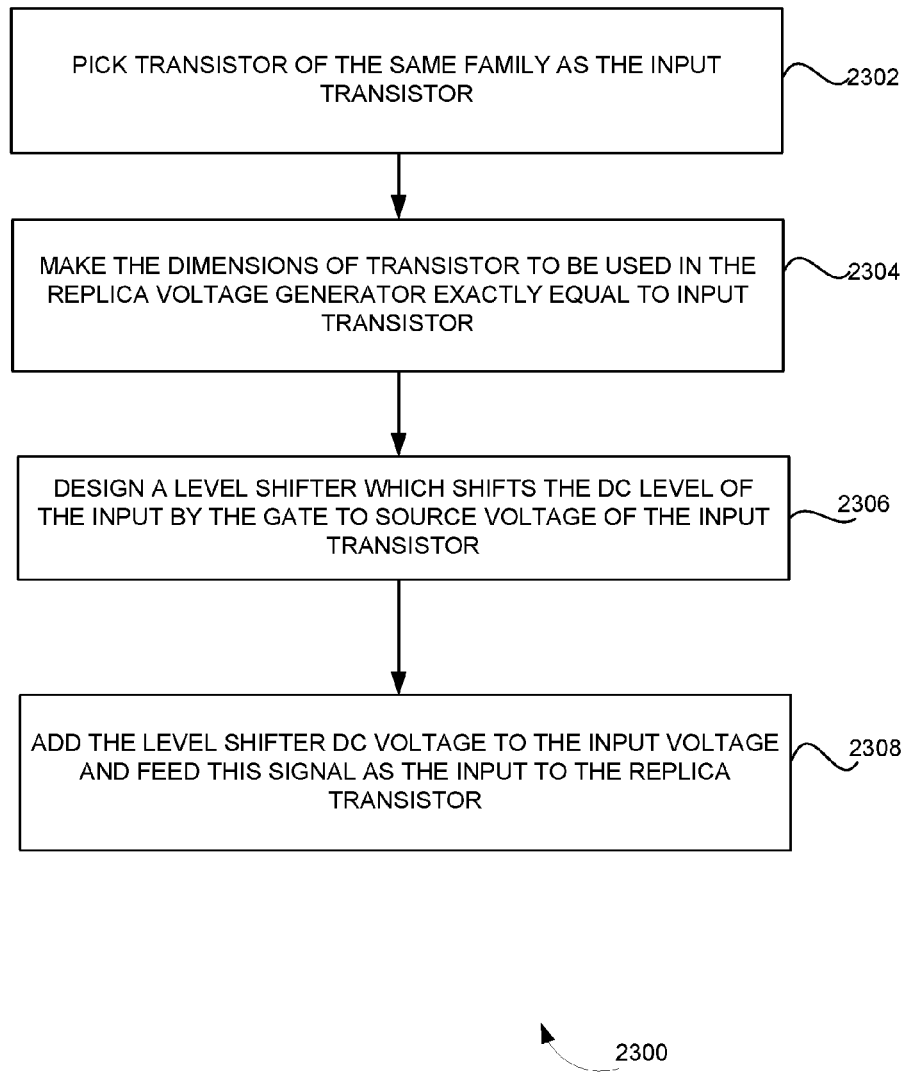
FIG. 23 is a flow diagram illustrating a method of implementing a voltage follower circuit of according to an embodiment herein.

FIG. 23 is a flow diagram 2300 illustrating a method of implementing a voltage follower circuit according to an embodiment herein. At step 2302, pick transistor of the same family as the input transistor. At step 2304, making the dimensions of the transistor to be used in the voltage replica generator exactly equal to the dimensions of the input transistor. At step 2306, designing a level shifter that shifts DC level of the input voltage Vin 104 by the gate to source voltage of the replica transistor. At step 2308, adding the level shifter DC voltage to the input voltage Vin 104 and feeding this signal to the input of the replica transistor.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

What is claimed is:

1. A voltage follower circuit to mitigate gain loss, said voltage follower circuit comprising:
a voltage replica generation circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit;
wherein said NMOS based voltage follower circuit comprises
(a) a NMOS transistor, which comprises a gate terminal, a drain terminal, and a source terminal, wherein said gate terminal is connected to an input voltage Vin, said source terminal is connected to a bias current source; and
(b) a NMOS voltage replica generator, wherein said NMOS voltage replica generator comprises one or more NMOS transistors wherein said NMOS voltage replica generator is connected to said drain terminal of said NMOS transistor and a fixed voltage, wherein said NMOS voltage replica generator creates a close replica of said input voltage Vin at said drain terminal of said NMOS transistor;

wherein said NPN BJT based voltage follower circuit, comprises
(a) a NPN BJT transistor that comprises a base terminal, a collector terminal, and an emitter terminal, wherein said base terminal is connected to said input voltage Vin, said emitter terminal is connected to said bias current source; and
(b) a NPN BJT voltage replica generator, that comprises one or more NPN BJT transistors, wherein said NPN BJT voltage replica generator is connected to said collector terminal and said fixed voltage;
wherein said n-channel JFET based voltage follower circuit comprises;
(a) a n-channel JFET transistor that comprises a gate terminal, a drain terminal, and a source terminal, wherein said gate terminal is connected to said input voltage Vin; and
(b) a n-channel JFET voltage replica generator, which comprises one or more n-channel JFET transistors, wherein said n-channel JFET voltage replica generator is connected to said n-channel JFET drain terminal and said fixed voltage;
wherein said PMOS based voltage follower circuit comprises
(a) a PMOS transistor that comprises a gate terminal, a source terminal, and a drain terminal, wherein said gate terminal is connected to said input voltage Vin; and
(b) a PMOS voltage replica generator, which comprises one or more PMOS transistors, wherein said PMOS voltage replica generator is connected to said PMOS drain terminal and a fixed voltage;
wherein said P-Channel JFET based voltage follower circuit comprises
(a) a P-Channel JFET transistor that comprises a gate terminal, a source terminal, and a drain terminal, wherein said gate terminal is connected to said input voltage Vin; and
(b) a P-Channel JFET voltage replica generator that comprises one or more P-Channel JFET transistors, wherein said P-Channel JFET voltage replica generator is connected to said drain terminal of said P-Channel transistor and said fixed voltage;
wherein said PNP BJT based voltage follower circuit comprises
(a) a PNP BJT transistor that comprises a base terminal, a emitter terminal, and a collector terminal, wherein said base terminal is connected to said input voltage Vin; and
(b) a PNP BJT voltage replica generator that comprises one or more PNP BJT transistors, wherein said PNP BJT voltage replica generator is connected to said collector terminal of said PNP BJT transistor and said fixed voltage.

2. A voltage follower circuit to mitigate gain loss caused by a finite output impedance of one or more transistors, said voltage follower circuit comprising:
a voltage follower circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit;
wherein said NMOS based voltage follower circuit comprises
(a) a first NMOS transistor that comprises a first gate terminal, a first drain terminal, and a first source terminal, wherein said first drain terminal is connected to said fixed voltage;
(b) a second NMOS transistor that comprises a second gate terminal, a second drain terminal, and a second source terminal, wherein said second gate terminal is connected to an input voltage Vin, said second drain terminal is connected to said first source terminal, and said second source terminal is connected to a bias current source; and
(c) a NMOS level shifter that is connected between said first gate terminal and said second gate terminal, wherein said NMOS level shifter adds a voltage depending on the process corner, a supply voltage, and a temperature;
wherein said NPN BJT based voltage follower circuit comprises
(a) a first NPN BJT transistor that comprises a first base terminal, a first collector terminal, and a first emitter terminal, wherein said first collector terminal is connected to said fixed voltage;
(b) a second NPN BJT transistor that comprises a second base terminal, a second collector terminal, and a second emitter terminal, wherein said second base terminal is connected to said input voltage Vin, said second collector terminal is connected to said first emitter terminal, and said emitter terminal is connected to said bias current source; and
(c) a NPN BJT level shifter that is connected between said first base terminal and said second base terminal, wherein said NPN BJT level shifter adds a voltage depending on the process corner, the supply voltage, and the temperature;
wherein said n-channel JFET based voltage follower circuit comprises
(a) a first n-channel JFET transistor that comprises a first gate terminal, a first drain terminal, and a first source terminal, wherein said first drain terminal is connected to said fixed voltage;
(b) a second n-channel JFET transistor that comprises a second gate terminal, a second drain terminal, and a second source terminal, wherein said second gate terminal is connected to said input voltage Vin, said second drain terminal is connected to said first source terminal, and said second source terminal is connected to said bias current source; and
(c) a n-channel JFET level shifter that is connected between said first gate terminal and said second gate terminal, wherein said n-channel JFET level shifter adds a voltage depending on the process corner, the supply voltage, and the temperature;
wherein said PMOS based voltage follower circuit comprises
(a) a first PMOS transistor that comprises a first gate terminal, a first source terminal, and a first drain terminal, wherein said first gate terminal is connected to said input voltage Vin and said first source terminal is connected to said bias current source;
(b) a second PMOS transistor that comprises a second gate terminal, a second source terminal, and a second drain terminal, wherein said second source terminal is connected to said first drain terminal and second drain terminal is connected to a ground terminal; and
(c) a PMOS level shifter that is connected between said first gate terminal and said second gate terminal, wherein said PMOS level shifter adds a voltage depending on the process corner, the supply voltage, and the temperature;
wherein said P-Channel JFET based voltage follower circuit comprises
(a) a first P-Channel JFET transistor that comprises a first gate terminal, a first source terminal, and a first drain terminal, wherein said first gate terminal is connected to said input voltage Vin and said first source terminal is connected to said bias current source;
(b) a second P-Channel JFET transistor that comprises a second gate terminal, a second source terminal, and a second drain terminal, wherein said second source terminal is connected to said first drain terminal and said second drain terminal is connected to said ground terminal; and
(c) a P-Channel JFET level shifter that is connected between said first gate terminal and said second gate terminal, wherein said P-Channel JFET level shifter adds a voltage depending on the process corner, the supply voltage, and the temperature.
wherein said PNP BJT based voltage follower circuit comprises
(a) a first PNP BJT transistor that comprises a first base terminal, a first emitter terminal, and a first collector terminal, wherein said first base terminal is connected to said input voltage Vin and said first emitter terminal is connected to said bias current source;
(b) a second PNP BJT transistor that comprises a second base terminal, a second emitter terminal, and a second collector terminal, wherein said second emitter terminal is connected to said first collector terminal and said second collector terminal is connected to said ground terminal; and
(c) a PNP BJT level shifter that is connected between said first base terminal and said second base terminal, wherein said PNP BJT level shifter adds a voltage depending on the process corner, the supply voltage, and the temperature.

3. A voltage follower circuit to mitigate gain loss caused by a finite output impedance of one or more transistors, said voltage follower circuit comprising:
a voltage follower circuit that is selected from a group comprising (i) a NMOS based voltage follower circuit, (ii) a NPN BJT based voltage follower circuit, (iii) a n-channel JFET based voltage follower circuit, (iv) a PMOS based voltage follower circuit, (v) a P-Channel JFET based voltage follower circuit, or (vi) a PNP BJT based voltage follower circuit;
wherein said NMOS based voltage follower circuit comprises;
(a) a first NMOS transistor that comprises a first gate terminal, a first drain terminal, and a first source terminal, wherein said first gate terminal is connected to an input voltage Vin, said source terminal is connected to a bias current source;
(b) a second NMOS transistor that comprises a second gate terminal, a second drain terminal, and a second source terminal, wherein said second gate terminal is connected to said input voltage Vin, said second drain terminal is connected to a fixed voltage, and said second source terminal is connected to said first drain terminal;
(c) a third NMOS transistor, which comprises a third gate terminal, a third drain terminal, and a third source terminal, wherein said third gate terminal is connected to input voltage Vin, said third drain terminal is connected to said second source terminal, and said source terminal is connected to said bias current source;
(d) a first NMOS level shifter, which is connected between said first gate terminal and said second gate terminal; and
(e) a second NMOS level shifter, which is connected between said second gate terminal and said third gate terminal;

wherein said PMOS based voltage follower circuit comprises;
(a) a first PMOS transistor that comprises a first gate terminal, a first source terminal, and a first drain terminal, wherein said first PMOS gate terminal is connected to input voltage Vin and said PMOS source terminal is connected to a bias current source;
(b) a second PMOS transistor that comprises a second gate terminal, a second source terminal, and a second drain terminal, wherein said second PMOS source terminal is connected to said first PMOS drain terminal and said second PMOS drain terminal is connected to a ground terminal;
(c) a third PMOS transistor, which comprises a third gate terminal, a third drain terminal, and a third source terminal, wherein third source terminal is connected to said second drain terminal, and said third drain terminal is connected to said ground terminal;
(d) a first PMOS level shifter that is connected between said first gate terminal and said second gate terminal; and
(e) a second PMOS level shifter that is connected between said second gate terminal and said third gate terminal;

wherein said NPN BJT based voltage follower circuit comprises;
(a) a first NPN BJT transistor that comprises a first base terminal, a first collector terminal, and a first emitter terminal;
(b) a second NPN BJT transistor that comprises a second base terminal, a second collector terminal, and a second emitter terminal, wherein said first emitter terminal is connected to said second collector terminal, said second emitter terminal is connected to said bias current source, and said first collector terminal is connected to said fixed voltage;
(c) a third NPN BJT transistor, which comprises a third base terminal, a third collector terminal, and a third emitter terminal, wherein said third base terminal is connected to said input voltage Vin, said third collector terminal is connected to said second emitter terminal of said second NPN BJT transistor, and said third emitter terminal is connected to said bias current source;
(d) a first NPN BJT level shifter that is connected between said first base terminal and said second base terminal;
(e) a second NPN BJT level shifter that is connected between said second base terminal and said third base terminal;

wherein said n-channel JFET based voltage follower circuit comprises;
(a) a first n-channel JFET transistor that comprises a first gate terminal, a first drain terminal, and a first source terminal;
(b) a second n-channel JFET transistor that comprises a second gate terminal, a second drain terminal, and a second source terminal, wherein said first source terminal is connected to said second drain terminal, said second source terminal is connected to said bias current source and said first drain terminal is connected to said fixed voltage;
(c) a third n-channel JFET transistor, which comprises a third gate terminal, a third drain terminal, and a third source terminal, wherein said third gate terminal is connected to said input voltage Vin, said third drain terminal is connected to said second source terminal, and said third source terminal is connected to said bias current source;
(d) a first n-channel JFET level shifter that is connected between said first gate terminal and said second gate terminal; and
(e) a second n-channel JFET level shifter that is connected between said second gate terminal and said third gate terminal;

wherein said P-Channel JFET based voltage follower circuit comprises;
(a) a first P-Channel JFET transistor that comprises a first gate terminal, a first source terminal, and a first drain terminal;
(b) a second P-Channel JFET transistor that comprises a second gate terminal, a second source terminal, and a second drain terminal, wherein said first source terminal is connected to said bias current source, said first drain terminal is connected to said second source terminal, and said second drain terminal is connected to said ground terminal;
(c) a third P-Channel JFET, which comprises a third gate terminal, a third source terminal, and a third drain terminal, wherein said third drain terminal is connected to said ground terminal, and said third source terminal is connected to said second drain terminal;
(d) a first P-Channel JFET level shifter that is connected between said first gate terminal and said second gate terminal; and
(e) a second P-Channel JFET level shifter that is connected between said second gate terminal and said third gate terminal;

wherein said PNP BJT based voltage follower circuit comprises;
(a) a first PNP BJT transistor that comprises a first base terminal, a first emitter terminal, and a first collector terminal;
(b) a second PNP BJT transistor that comprises a second base terminal, a second emitter terminal, and a second collector terminal, wherein said first collector terminal is connected to said second emitter terminal, said second collector terminal is connected to said fixed voltage and said first emitter terminal is connected to said bias current source;
(c) a third PNP BJT transistor, which comprises a third base terminal, a third emitter terminal, and a third collector terminal, wherein said third emitter terminal is connected to said second collector terminal of said second PNP BJT terminal, and said third collector terminal is connected to said ground terminal;
(d) a first PNP BJT level shifter that is connected between said first base terminal and to said second base terminal; and
(e) a second PNP BJT level shifter that is connected between said second base terminal and to said third base terminal.

* * * * *